(12) United States Patent
Smith, Jr. et al.

(10) Patent No.: US 11,817,893 B2
(45) Date of Patent: Nov. 14, 2023

(54) HYBRIDIZED WIDEBAND NOTCH FILTER TOPOLOGIES AND METHODS

(71) Applicant: pSemi Corporation, San Diego, CA (US)

(72) Inventors: William Richard Smith, Jr., Lake in the Hills, IL (US); Muhammed Ibrahim Sezan, Carlsbad, CA (US); Dan William Nobbe, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/216,457

(22) Filed: Mar. 29, 2021

(65) Prior Publication Data

US 2022/0311464 A1  Sep. 29, 2022

(51) Int. Cl.
*H04B 1/10* (2006.01)
*H04B 1/04* (2006.01)

(52) U.S. Cl.
CPC ......... *H04B 1/1036* (2013.01); *H04B 1/0483* (2013.01); *H04B 2001/1063* (2013.01); *H04B 2001/1072* (2013.01)

(58) Field of Classification Search
CPC ...... H03H 9/542; H03H 9/6483; H03H 9/605; H03H 9/64; H03H 9/547; H03H 9/568;
(Continued)

(56) References Cited

U.S. PATENT DOCUMENTS 6,862,441 B2  3/2005 Ella
9,024,700 B2  5/2015 Ranta
(Continued)

FOREIGN PATENT DOCUMENTS

EP  3496278  6/2019

OTHER PUBLICATIONS

Liu, et al., "Materials, Design, and Characteristics of Bulk Acoustic Wave Resonator: A Review", Micromachines 2020, 11, 630, MDPI, Jun. 28, 2020, 26 pgs.
(Continued)

*Primary Examiner* — Golam Sorowar
(74) *Attorney, Agent, or Firm* — JAQUEZ LAND GREENHAUS & McFARLAND LLP; John Land, Esq.

(57) ABSTRACT

Radio frequency (RF) acoustic wave resonator (AWR) filter circuits and methods. Embodiments essentially de-couple the stopband or notch characteristics of an RF filter from the passband characteristics. Accordingly, the de-coupled parameters can be individually designed to meet the specifications of a particular application. Partially-hybridized or fully-hybridized series-arm and parallel-arm AWR filter building blocks enable "de-coupled" RF filters having (1) wideband and low insertion loss passbands and (2) wideband deep notches (stopbands) with a specifically placed notch center frequency, without compromising the passband characteristics. The AWR filter building blocks include an inductance L that matches (resonates with) the electrostatic capacitance CO of the corresponding AWR within a desired passband. The resonance and anti-resonance frequencies of the building block AWRs are selected to be spaced apart from the specified passband in order to provide independent stopband or notch characteristics without substantially affecting the passband characteristics.

13 Claims, 15 Drawing Sheets

(58) Field of Classification Search
CPC .......... H03H 9/54; H03H 9/706; H03H 9/205; H03H 9/725; H03H 9/465; H03H 2009/02204; H03H 2210/025; H03H 7/38; H03H 7/0115; H03H 9/02007; H03H 2250/00; H03H 9/6403; H03H 2007/013; H03H 2210/015; H03H 2210/036; H03H 2210/04; H03H 2240/00; H03H 7/40; H03H 7/463; G06F 30/36; G06F 30/327; G06F 30/30; G06F 30/367; G06F 30/398; G06F 2119/18; G06F 30/373; G06F 30/392; G06F 2111/10; G06F 2119/08; G06F 3/162; G06F 30/20; G06F 30/3323; G06F 30/39; H04B 1/1036; H04B 1/40; H04B 1/0475; H04B 1/0057; H04B 1/006; H04B 1/10; H04B 1/18; H04B 1/50; H04B 1/525; H04B 2001/1063; H04B 1/48; H04B 2001/485

See application file for complete search history.

(56) References Cited

U.S. PATENT DOCUMENTS

| | | | |
|---|---|---|---|
| 9,197,194 | B2 | 11/2015 | Reedy et al. |
| 9,300,038 | B2 | 3/2016 | Burgener et al. |
| 10,491,192 | B1 | 11/2019 | Plesski et al. |
| 2014/0145799 | A1 | 5/2014 | Jian et al. |
| 2016/0294357 | A1* | 10/2016 | Tani ........................ H03H 9/542 |
| 2016/0294423 | A1 | 10/2016 | Yatsenko et al. |
| 2017/0331457 | A1* | 11/2017 | Satoh ..................... H03H 9/605 |
| 2018/0241367 | A1* | 8/2018 | Horita ...................... H03H 7/38 |

OTHER PUBLICATIONS

UMTS Frequency Bands, https://en.wikipedia.org/wiki/UMTS_frequency_bands, Wikipedia.org, last updated Jun. 27, 2021.
5G NR Frequency Bands, https://en.wikipedia.org/wiki/5G_NR_frequency_bands, Wikipedia.org, last updated Jul. 14, 2021.
Maget, Judith, International Search Report and Written Opinion received from the EPO dated Jun. 17, 2022 for appln. No. US/PCT2022/020442, 14 pgs.
Mourot, et al., "Band Reject Filter in BAW Technology", European Microwave Conference, 2008, pp. 349-352.
Warder, et al., "Golden Age for Filter Design: Innovative and Proven Approaches for Acoustic Filter, Duplexer and Multiplexer", IEEE Microwave Magazine, vol. 16, No. 7, Aug. 2015, pp. 60-72.
Allen, et al., "Simultaneous Analog Tuning of the Series-and-Anti-Resonances of Acoustic Wave Resonators", Wireless and Microwave Technology Conference, Apr. 2018 (Apr. 2018), pp. 1-3.

* cited by examiner

HYBRIDIZED WIDEBAND NOTCH FILTER TOPOLOGIES AND METHODS

BACKGROUND

(1) Technical Field

This invention relates to electronic circuits, and more particularly to radio frequency electronic circuits and related methods.

(2) Background

Many modern electronic systems include radio frequency (RF) transceivers; examples include cellular telephones, personal computers, tablet computers, wireless network components, televisions, cable system "set top" boxes, automobile communication systems, wireless sensing devices, and radar systems. Many RF transceivers are quite complex two-way capable of transmitting and receiving in duplex or half-duplex modes across multiple frequencies in multiple bands; for instance, in the United States, the 2.4 GHz band is divided into 14 channels spaced about 5 MHz apart. As another example, a modern "smart telephone" may include RF transceiver circuitry capable of concurrently operating on different cellular communications systems (e.g., GSM, CDMA, LTE, and 5G in multiple bands within the 600-6000 MHz range), on different wireless network frequencies and protocols (e.g., various IEEE 802.11 "WiFi" protocols at 2.4 GHz and 5 GHz), and on "personal" area networks (e.g., Bluetooth based systems).

A simple radio system generally operates in one radio frequency (RF) band for transmitting RF signals and a separate RF band for receiving RF signals. An RF band typically spans a range of frequencies (e.g., 10 to 100 MHz per band), and actual signal transmission and reception may be in sub-bands or channels of such bands, which may overlap. Alternatively, two widely spaced RF bands may be used for signal transmission and reception, respectively.

More advanced radio systems, such as some cellular telephone systems, may be operable over multiple RF bands for signal transmission and reception, but at any one time still use only one transmit sub-band and one receive sub-band within a single RF band, or only two widely spaced transmit and receive RF bands. Such multi-band operation allows a single radio system to be interoperable with different international frequency allocations and signal coding systems (e.g., CDMA, GSM). For some applications, international standards bodies have labeled common frequency bands with labels. For instance, bands covered by the LTE standard are commonly labeled a "Bn" (e.g., B1, B3, B7); one listing of such bands may be found at https://en.wikipedia.org/wiki/UMTS_frequency_bands. As another example, bands covered by the fifth generation (5G) technology standard for broadband cellular networks are commonly labeled from n1 to n98; see, for instance, the listing at https://en.wikipedia.org/wiki/5G_NRfrequency_bands.

In recent years, a technique called "Carrier Aggregation" (CA) has been developed to increase bandwidth for RF radio systems, and in particularly cellular telephone systems. In one version of CA known as "inter-band" mode, cellular reception or transmission may occur over multiple RF bands simultaneously (e.g., RF bands B1, B3, and B7). This mode requires passing the receive or transmit RF signal through multiple band filters simultaneously, depending on the required band combination.

A design challenge in advanced radio systems is dealing with RF interference. For instance, simultaneous asynchronous transmission and reception over different nearby bands generally causes RF noise/leakage from transmission over one band to interfere with reception over another band. As one example, cellphone transmission at the low end of the n41 band (2496-2690 MHz) may generate noise/leakage in the n40 band (2300-2400 MHz) between cellphones as well as within the transmitting cellphone. In addition, cellphone transmission over the n41 band may generate noise/leakage in the 2.4 GHz WiFi band (2402-2480 MHz).

RF interference may also arise in systems using inter-band carrier aggregation with non-contiguous resource block allocation (e.g., bands n77 and n79). Transmission leakage may impact reception within the same communication device despite antenna and diplexer isolation. As another example, communication devices (e.g., cellphones) that operate over different generations of band allocations (e.g., LTE and NR bands such as B42 and n79) may similarly experience interference on the reception path from self-transmissions.

Conventionally, notch and bandpass filters have been used to isolate or pass RF signals within a transceiver. For example, FIG. 1 is a simplified block diagram of a prior art transceiver 100. Radio frequencies received by an antenna 102 may be directed by means of a routing device (e.g., a switch or a diplexer) 104 to a receive path. The receive path generally includes a set of RF filters 106 that provide a filtered RF output to one or more low-noise amplifiers (LNAs) 108, which provide an amplified RF signal to reception (Rx) mixing, backend, and baseband circuitry 110. Transmission (TX) mixing, backend, and baseband circuitry 112 provides an outgoing RF signal to one or more power amplifiers (PAs) 114. The amplified output of PAs 114 is processed through a set of RF filters 116 before being conveyed to the routing device 104 and transmitted by the antenna 102.

The Tx and Rx filters 106, 116 often comprise sets of one or more notch filters and/or bandpass filters per band or aggregation of bands. A particular challenge is designing filters that provide a high level of attenuation (e.g., for some bands, at least 25 dB, and preferably more than 30 dB) for the notch filters to eliminate unwanted Tx noise/leakage without necessarily decreasing Tx power and/or restricting resource allocation in the Tx band. It is also desirable to have flexible notch filtering solutions that can be optimized and/or reconfigured for different bands and combinations or aggregations of bands, or for different telecommunication system operators in different regions.

SUMMARY

The invention encompasses high performance radio frequency (RF) acoustic wave resonator (AWR) filter circuits and methods for designing such filter circuits. The inventive RF filter circuits provide a high level of attenuation at selected frequencies to eliminate unwanted RF transmission (Tx) noise/leakage without necessarily decreasing Tx power and/or restricting resource allocation in the Tx band. Embodiments include flexible notch filtering solutions that can be optimized and/or reconfigured for different bands and combinations or aggregations of bands, or for different telecommunication system operators in different regions.

Embodiments essentially de-couple the stopband or notch characteristics of an RF filter from the passband characteristics of the RF filter. Accordingly, each of those de-coupled parameters can be individually designed to meet the specifications of a particular application. Partially-hybridized or fully-hybridized series-arm and parallel-arm AWR filter building blocks in accordance with the present invention can be used to build RF filters having "de-coupled" or essentially independent passband and stopband characteristics. Such "de-coupled" RF filters can have (1) wideband and low insertion loss passbands and (2) wideband deep notches (stopbands) with a specifically placed notch center frequency, without compromising the passband characteristics.

Embodiments include series-arm and parallel-arm AWR filter building blocks each having an inductance L that matches (resonates with) the electrostatic capacitance C0 of the corresponding AWR within a desired passband. The series-arm and parallel-arm AWR filter building blocks are designed such that both the resonance frequency and the anti-resonance frequency of the respective AWR are selected to be spaced apart in frequency from the specified passband for the corresponding building block, in order to provide independent stopband or notch characteristics without substantially affecting the passband characteristics.

Methods encompassed by the present invention include selecting a series-arm AWR having an electrostatic capacitance C0 small enough to be compatible with a deep stopband/notch, whose resonance frequency and anti-resonance frequency are spaced apart in frequency from a desired passband; selecting a parallel-arm AWR having an electrostatic capacitance C0 large enough to be compatible with a deep stopband/notch and larger than the electrostatic capacitance C0 of the series-arm AWR, whose resonance frequency and anti-resonance frequency are spaced apart in frequency from the desired passband; coupling the parallel-arm AWR in a shunt configuration with the series-arm AWR; tuning out the electrostatic capacitance C0 of the series-arm AWR within the desired passband; and tuning out the electrostatic capacitance C0 of the parallel-arm AWR within the desired passband, wherein the series-arm AWR and the parallel-arm AWR resonance frequencies and the anti-resonance frequencies define a notch band for the radio frequency filter circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless the context otherwise indicates.

DETAILED DESCRIPTION

The invention encompasses high performance radio frequency (RF) acoustic wave resonator (AWR) filter circuits and methods for designing such filter circuits. The inventive RF filter circuits provide a high level of attenuation at selected frequencies to eliminate unwanted RF transmission (Tx) noise/leakage without necessarily decreasing Tx power and/or restricting resource allocation in the Tx band. Embodiments include flexible notch filtering solutions that can be optimized and/or reconfigured for different bands and combinations or aggregations of bands, or for different telecommunication system operators in different regions.

Acoustic Wave Resonators as Filter Components

An RF filter is a component or circuit configured to pass some radio frequencies with relatively low signal loss and to block or substantially attenuate other radio frequencies. The range of frequencies passed by a filter is the "passband". An RF filter passband for a particular application may be defined as a frequency range where the insertion loss (IL) of the filter is less than a specified value such, as 1 dB or 3 dB. The range of frequencies stopped by a filter is the "stopband" or "notch" band. An RF filter stopband for a particular application may be defined as a frequency range where the rejection of the filter is more than a specified value, such as 25 dB or 30 dB. A typical RF filter has at least one passband and at least one stopband.

Figure 2:
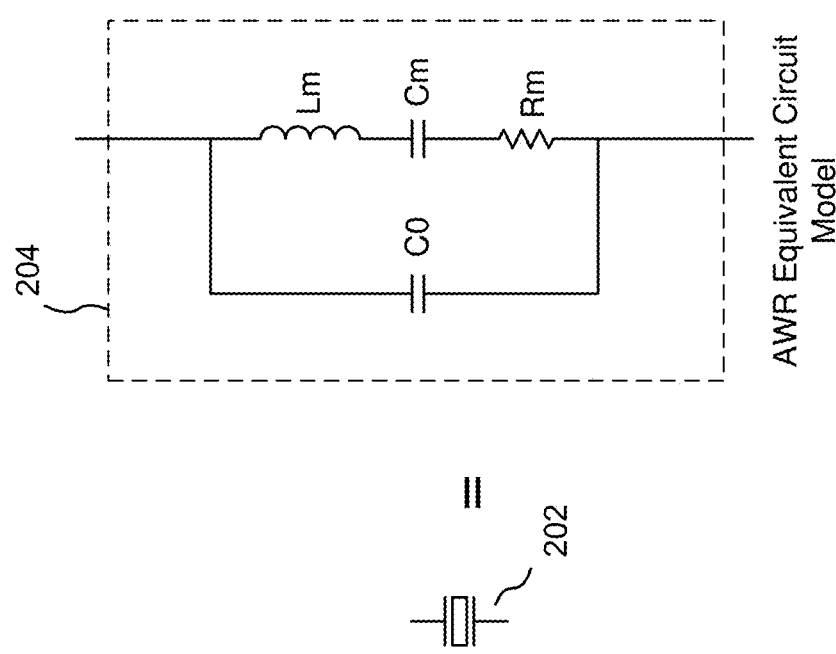
FIG. 2 is a diagram of a common symbol for an acoustic wave resonator (AWR) and the equivalent circuit model for an AWR.

RF filters for present communication systems commonly incorporate one or more acoustic wave resonators, including surface acoustic wave (SAW) resonators, bulk acoustic wave (BAW) resonators, film bulk acoustic resonators (FBAR), and transversely-excited film bulk acoustic resonators (XBAR). FIG. 2 is a diagram of a common symbol 202 for a prior art acoustic wave resonator (AWR) and the equivalent circuit model 204 for an AWR. The equivalent circuit model 204 (known as the Butterworth Van Dyke model) includes an inductor Lm, a capacitor Cm, and a resistor Rm coupled in series and representing the motional (acoustic) characteristics of an AWR near a resonance point, while a bracketing parallel capacitor C0 represents the electrostatic plate capacitance of the AWR (noting that an AWR physically comprises two electrodes structures separated by a dielectric). C0 values are typically chosen such that their reactance, $1/(2\pi \times f \times C0)$ is in the general range of about 50 ohms. For each AWR, Cm will be related to C0 by: $Cm = 8 \times k_{eff}^2 \times C0/\pi^2$, where $k_{eff}^2$ is the effective electromechanical coupling coefficient of the AWR and depends on the material properties used to fabricate the AWR. Therefore, Cm is smaller than C0, while Lm, which resonates with Cm at the resonance frequency, tends to be quite large. AWR equivalent elements C0, Lm, Cm, and Rm have some effect at all frequencies, but their combined behavior results in a resonance and an anti-resonance. Accordingly, at frequencies well below and well above the resonance and anti-resonance frequencies, the Lm, Rm, Cm series arm will look like an open circuit (at low frequencies, Cm has high impedance, while at high frequencies, Lm has high impedance), making the overall circuit behave as C0 alone.

Note that when it is stated in this disclosure that a circuit creates a resonance with C0, there may be some residual inductance or capacitance from the acoustic branch of the AWR at the desired frequency. For example, at a desired passband frequency $f_P$ higher than the resonance frequency fr and antiresonance frequency fa of the AWR, the susceptance $B_P$ of a parallel-arm AWR is slightly less than the susceptance $B_{C0}$ attributable to just C0 (noting also that the resonance frequency fr and antiresonance frequency fa of the AWR will both be spaced above or below the desired passband frequency $f_P$, as explained below). The value of an inductance L needed to tune out $B_P$ ($L=1/[2\pi \times f_P \times B_P]$) thus needs to be slightly larger than the value of an inductance needed to tune out the susceptance $B_{C0}$ attributable to just C0; however, the difference is slight, typically a few percent. Conversely, if $f_P$ is lower than fr and fa, then the value of an inductance L needed to tune out $B_P$ ($L=1/[2\pi \times f_P \times B_P]$) would need to be slightly smaller. A similar argument applies to the dual case of a series inductance L tuning out the reactance of a series-arm AWR with a similar result. Thus, while "C0" is used in this disclosure to denote the value with respect to achieving resonance with other circuits, the actual value with which other circuits must resonate may be the actual value of C0 in parallel with such residual acoustic reactance. Of note, the element C0 alone is a good approximate representation of an entire AWR at frequencies sufficiently displaced from the desired notch frequency.

Figure 3:
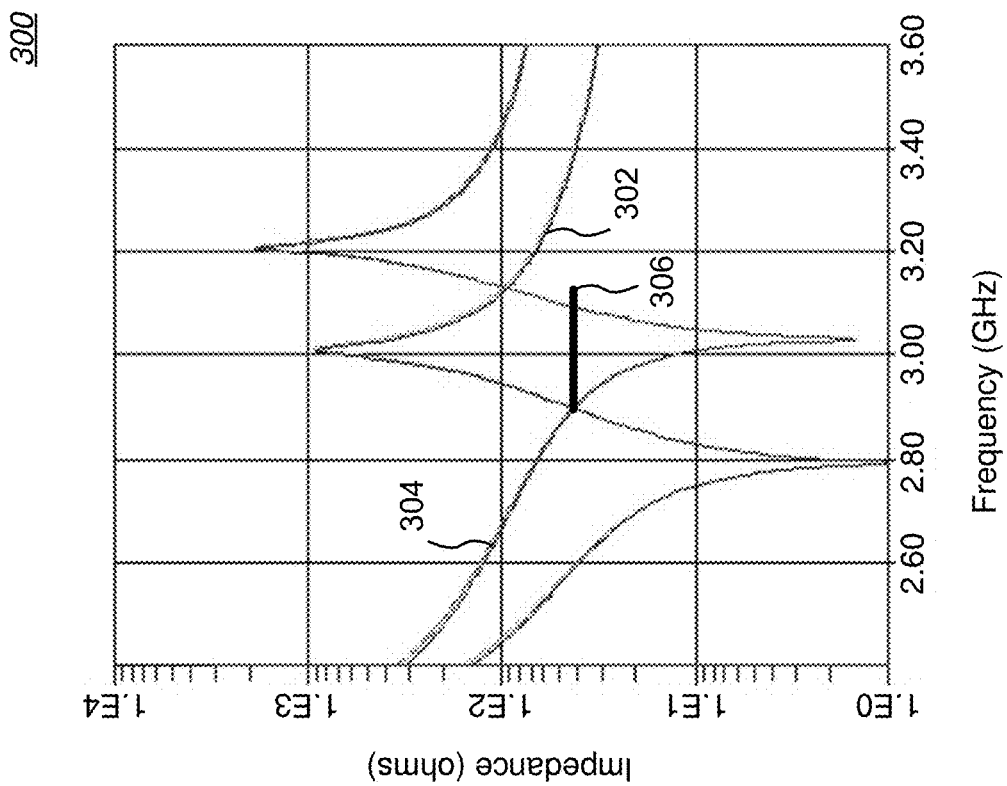
FIG. 3 is a graph of the impedance of two prior art ideal AWRs as a function of frequency.

Acoustic wave resonators may be fabricated using conventional integrated circuit manufacturing techniques and with different frequency characteristics. For example, FIG. 3 is a graph 300 of the impedance of two prior art ideal AWRs as a function of frequency. Graph curve 302 shows that a first AWR has a resonance frequency (lowest impedance) at about 2.80 GHz and an anti-resonance frequency (highest impedance) at about 3.00 GHz. Graph curve 304 shows that a second AWR has a resonance frequency at about 3.04 GHz and an anti-resonance frequency at about 3.20 GHz.

A figure of merit (FOM) parameter for an AWR may be defined as $FOM=k_{eff}^2 \times Q$, where $k_{eff}^2$ is the effective electromechanical coupling coefficient and Q is the quality factor. A larger value for $k_{eff}^2$ gives a wider bandwidth, which is quite desirable at some operational frequencies (e.g., the mid-band 5G frequencies from 2.5-3.7 GHz).

Acoustic wave RF filters usually incorporate multiple AWRs. For example, an acoustic wave RF filter using the well-known "ladder" filter architecture generally includes at least one parallel-arm AWR (also known as shunt-arm AWRs) and at least one series-arm AWR. In conventional acoustic wave RF bandpass filter designs, a parallel-arm AWR typically has a resonance frequency below the passband of the filter and an anti-resonance frequency within the passband. Conversely, a series-arm AWR typically has a resonance frequency within the passband of the filter and an anti-resonance frequency above the passband.

For example, referring to FIG. 3, an acoustic wave RF filter in which the parallel-arm AWRs have resonance/anti-resonance curves like graph line 302 and the series-arm AWRs have resonance/anti-resonance curves like graph line 304 will have a passband in the frequency range covered by graph line 306. In the passband, the parallel-arm AWRs are essentially open-circuits and the series-arm AWRs are essentially short-circuits. Both below and above the passband, the general level of stopband attenuation is generally dependent on the ratio of the C0 capacitances of the parallel-arm resonators to the C0 capacitances of the series-arm resonators, since, away from the resonance and anti-resonance frequencies, the AWR's are approximately just capacitors and the filter circuit acts as a capacitive voltage-divider ladder. There will be two narrow notches very close to the passband—for example in FIG. 3, the short-circuit in curve 302 and the open-circuit of curve 304 will result in narrow notches at about 2.80 GHz and 3.20 GHz, respectively. These notches are not controllable independently of the bandpass characteristic. The most important limitation of this type of bandpass filter, evident from FIG. 3, is that the maximum available bandwidth (graph line 306) cannot significantly exceed the separation fa−fr between the resonance frequency fr and the anti-resonance frequency fa of the AWR's. Since fa is given by $fr \times sqrt[1+(8/\pi^2) \times k_{eff}^2]$, the relative separation (fa−fr)/fr is limited to about $0.5 \times k_{eff}^2$. The upper limit on fractional bandwidth for SAW resonators is about 2%, for BAW resonators, about 4-5% (even with dopants that increase $k_{eff}^2$), and for XBAR resonators, about 10%.

Notably, away from their resonance and anti-resonance frequencies, all acoustic wave resonators are a good approximation of simple electrostatic capacitors. Embodiments of the present invention utilize this attribute to essentially de-couple the design of the stopband or notch characteristics of an RF filter from the passband characteristics of the RF filter.

AWR Building Blocks for RF Filters

Figure 4:
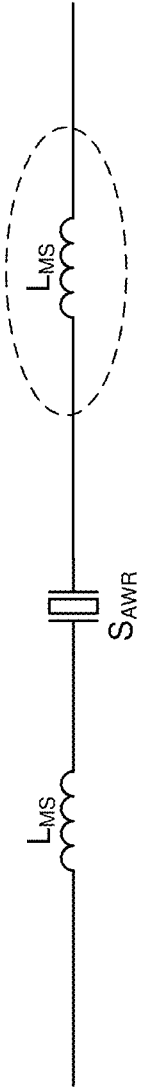
FIG. 4 is a schematic diagram of a simple series-arm AWR filter building block in accordance with the present invention.

FIG. 4 is a schematic diagram of a simple series-arm AWR filter building block 400 in accordance with the present invention. A series-arm acoustic wave resonator $S_{AWR}$ has at least one terminal series coupled to a series-arm matching inductor $L_{MS}$. In some cases, the inductance in the building block circuit (or "arm") may be split between two inductors coupled to opposite terminals of the AWR $S_{AWR}$, as indicated in FIG. 4 by a second series-arm matching inductor $L_{MS}$ within a dotted oval. The split inductance may be useful when building up RF filters having more than one series-arm AWR filter building block 400 coupled in series (see, for example, FIGS. 10 and 11 below). In some embodiments, the series-arm matching inductor(s) $L_{MS}$ may be adjustable (e.g., digitally tunable inductors or DTLs). Examples of DTL's are described in U.S. Pat. No. 9,197,194, issued on Nov. 24, 2015, entitled "Method and Apparatus for Use in Tuning Reactance in an Integrated Circuit Device", assigned to the assignee of the present invention and hereby incorporated by reference.

An important aspect of the series-arm AWR filter building block 400 is that both the resonance frequency and the anti-resonance frequency of the series-arm AWR $S_{AWR}$ are selected to be spaced apart in frequency from the specified passband for a particular series-arm AWR filter building block 400. For example, the series-arm AWR $S_{AWR}$ resonance and anti-resonance frequencies are selected to be below the specified passband for a particular series-arm AWR filter building block 400 if the passband is to be at a higher frequency than the stopband. Conversely, the series-arm AWR $S_{AWR}$ resonance and anti-resonance frequencies are selected to be above the specified passband for a particular series-arm AWR filter building block 400 if the passband is to be at a lower frequency than the stopband. This contrasts with conventional AWR bandpass filter designs in which a series-arm AWR typically has a resonance frequency within the passband and an anti-resonance frequency above the passband. Accordingly, in embodiments of the present invention, the passband characteristics of the series-arm AWR filter building block 400 are essentially independent of its notch filtering characteristics, as further described below.

Another important aspect of the series-arm AWR filter building block 400 is that the total inductance of the coupled series-arm matching inductor(s) $L_{MS}$ matches the capacitance C0 of the associated series-arm AWR $S_{AWR}$. "Matching" the series-arm inductor(s) $L_{MS}$ means selecting a total inductance value that resonates with (i.e., tunes out) the electrostatic capacitance C0 of the series-arm AWR $S_{AWR}$ around the center frequency of a desired passband. The resulting series-resonant LC circuit and the selection of the resonance/anti-resonance frequencies outside the passband makes the series-arm AWR filter building block 400 behave like a short-circuit within the passband ($L_{MS}$ in series resonance with C0 in $S_{AWR}$).

Figure 5:
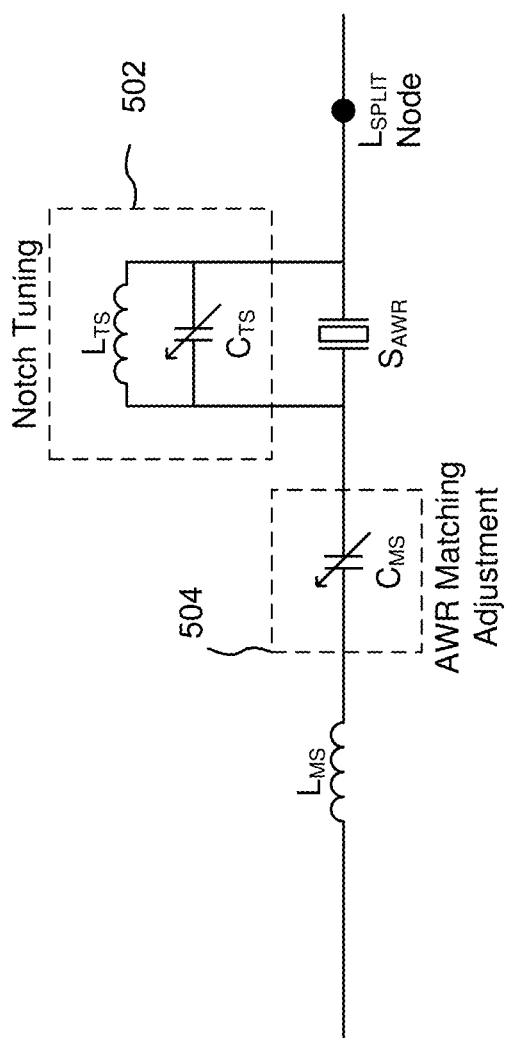
FIG. 5 is a schematic diagram of an advanced series-arm AWR filter building block in accordance with the present invention.

FIG. 5 is a schematic diagram of an advanced series-arm AWR filter building block 500 in accordance with the present invention. The advanced series-arm AWR filter building block 500 starts with the simple series-arm AWR filter building block 400 of FIG. 4 and adds one or two optional features.

The first optional feature in FIG. 5 is a series-arm Notch Tuning circuit 502 that includes, in the illustrated embodiment, a series-arm tuning inductor $L_{TS}$ and a series-arm tuning capacitor $C_{TS}$ coupled in parallel with the series-arm AWR $S_{AWR}$. The resulting LC series-arm Notch Tuning circuit 502 in parallel with the series-arm AWR $S_{AWR}$ allows tuning of the anti-resonance frequency of the advanced series-arm AWR filter building block 500 without affecting its resonance frequency. Consequently, in a complete RF filter with both series-arms and parallel-arms, the series-arm Notch Tuning circuit 502 provides the ability to tune the center frequency of the notch filter characteristics of the RF filter and/or the depth (level of attenuation) and width of the notch (see FIGS. 13 and 14 below for examples). Note that in some embodiments, the series-arm Notch Tuning circuit 502 may comprise only an adjustable series-arm tuning inductor $L_{TS}$ or only an adjustable series-arm tuning capacitor $C_{TS}$.

A second optional feature is a series-arm AWR Matching Adjustment circuit 504 that includes a series-arm match-adjustment capacitor $C_{MS}$ coupled between the series-arm AWR $S_{AWR}$ and the series-arm matching inductor $L_{MS}$. The combination of the series-arm matching inductor $L_{MS}$ and the series-arm match-adjustment capacitor $C_{MS}$ provides a variable LC matching circuit that can be adjusted (in contrast to just the fixed inductor LMS) so that the series-arm AWR filter building block 500 can be made to look like a short-circuit within the passband frequency range. This variable LC matching circuit allows adjustment of the matching, which may be necessary (or at least desirable) when the Notch Tuning circuit 502 is used.

If the series-arm matching inductor $L_{MS}$ is used alone, as in FIG. 4, its value is chosen so as to series-resonate the capacitance C0 of the series-arm AWR at or near the center of the desired passband, thereby making the series-arm AWR filter building block 400 act as a short-circuit in the passband. If a series-arm match-adjustment capacitor $C_{MS}$ is added, as in FIG. 5, its purpose is to create, along with $L_{MS}$, an adjustable effective inductance $L_{eff}=L_{MS}\times\{1-1/[(2\times\pi\times f)^2\times L_{MS}\times C_{MS}]\}$. By varying the value of capacitor $C_{MS}$, small adjustments may be made in the value of $L_{eff}$, such as might be needed to maintain the short-circuit characteristic of the series-arm AWR filter building block 500 in the desired passband when the Notch Tuning circuit 502 is used. Note that: (1) in the above expression for $L_{eff}$, if $C_{MS}$ is set to infinity, then $L_{eff}=L_{MS}$, meaning that $C_{MS}$ is effectively replaced by a short circuit; and (2) as $C_{MS}$ is made smaller, $L_{eff}$ also gets smaller, meaning that the variable range of $L_{eff}$ lies entirely below the value of $L_{MS}$. It follows that in order to have $L_{eff}$ of the advanced series-arm AWR filter building block 500 in FIG. 5 attain the value of the series-arm matching inductor $L_{MS}$ shown in FIG. 4, the series-arm matching inductor $L_{MS}$ in FIG. 5 must have a larger value than the series-arm matching inductor $L_{MS}$ in FIG. 4.

As the name implies, the series-arm match-adjustment capacitor $C_{MS}$ is adjustable to provide a range of fine-tuning adjustments to maintain matching between the series-arm matching inductor $L_{MS}$ and the electrostatic capacitance C0 of the series-arm AWR $S_{AWR}$. For example, adding the optional series-arm Notch Tuning circuit 502 and setting the notch filter characteristics to desired width, depth, and/or center frequency values may have an effect on the matching of the series-arm matching inductor $L_{MS}$ to the electrostatic capacitance C0 of the series-arm AWR $S_{AWR}$. The series-arm match-adjustment capacitor $C_{MS}$ allows some latitude in maintaining that match when the Notch Tuning circuit 502 is included and the series-arm tuning capacitor $C_{TS}$ is varied.

The series-arm match-adjustment capacitor $C_{MS}$ may be adjusted by one or more methods. For example, once notch tuning values are known (e.g., by modeling or IC characterization), an IC embodiment may be adjusted by fixing a final capacitance value at the time of manufacture (e.g., by application of one or more mask layers to set a configuration) or during production testing or by a customer (e.g., by laser trimming or "blowing" fusible links). In embodiments in which the series-arm match-adjustment capacitor $C_{MS}$ is a digitally tunable capacitor (DTC), adjustment may be under program control (e.g., by IC input pins or control words, or by the use of look-up tables external or internal to an IC that includes the series match-adjustment capacitor $C_{MS}$) and settable during production testing or by a customer, or dynamically set in the field in response to environmental (physical and RF) characteristics, such as temperature, transmitter power settings, receiver sensitivity, bands in use, transmission band frequency resource block (RB) allocation, etc. Examples of DTC's are described in U.S. Pat. No. 9,024,700, issued on May 5, 2015, entitled "Method and Apparatus for use in Digitally Tuning a Capacitor in an Integrated Circuit Device", assigned to the assignee of the present invention and hereby incorporated by reference.

Also shown in FIG. 5 is a position or node, $L_{SPLIT}$ Node, at which a second series-arm matching inductor $L_{MS}$ may be located for particular applications, as noted above (FIGS. 8-11 below also show an $L_{SPLIT}$ Node for the same purpose). Note that, in general, the series order of the $L_{MS}$, $C_{MS}$, and $S_{AWR}$ components does not matter as to the performance of the circuit; however, if the series-arm matching inductance $L_{MS}$ is split into two physical inductors, the position of the dot marked $L_{SPLIT}$ is a natural place to insert the second part of $L_{MS}$. In some cases, when the parasitic capacitance of the physical components to ground is taken into account, some orderings might perform slightly better than others.

Another way of characterizing a series-arm AWR filter building block encompassed by the present invention is as either (1) "partially hybridized", meaning that the series-arm AWR $S_{AWR}$ is coupled to the series-arm matching inductor $L_{MS}$, or (2) "fully hybridized", meaning that the series-arm AWR $S_{AWR}$ is coupled to the series-arm matching inductor $L_{MS}$ and the series-arm Notch Tuning circuit 502, and optionally coupled to the series-arm AWR Matching Adjustment circuit 504. Accordingly, in both types of hybridization, an acoustic wave resonator is combined with at least one matching inductor, in contrast to conventional designs in which RF filters are generally purely LC networks or purely AWR networks.

Figure 6:
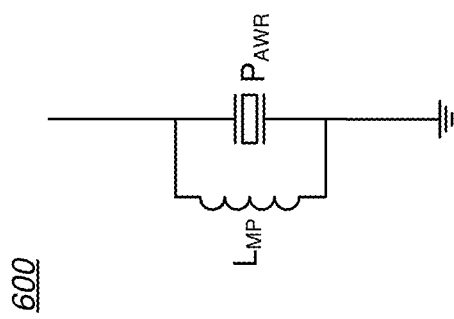
FIG. 6 is a schematic diagram of a simple parallel-arm AWR filter building block in accordance with the present invention.

FIG. 6 is a schematic diagram of a simple parallel-arm AWR filter building block 600 in accordance with the present invention. The parallel-arm AWR filter building block 600 includes a parallel-arm matching inductor $L_{MP}$ coupled in parallel with a parallel-arm acoustic wave resonator $P_{AWR}$. The parallel-arm AWR filter building block 600 may be present in multiple instances in the filter network, typically along with one or more instances of the series-arm AWR filter building blocks 400 or 500 (see FIGS. 9 and 11 for examples).

An important aspect of the parallel-arm AWR filter building block 600 is that both the resonance frequency and the anti-resonance frequency of the parallel-arm AWR $P_{AWR}$ are selected to be spaced apart in frequency from the specified passband for a particular parallel-arm AWR filter building block 600. This contrasts with conventional AWR bandpass filter designs in which a shunt (parallel arm) AWR typically has a resonance frequency below the passband and an antiresonance frequency within the passband. Accordingly, in embodiments of the present invention, the passband characteristics of the parallel-arm AWR filter building block 600 are essentially independent of its notch filtering characteristics, as further described below.

Another important aspect of the parallel-arm AWR filter building block 600 is that the coupled parallel-arm matching inductor(s) $L_{MP}$ matches the capacitance C0 of the associated parallel-arm AWR $P_{AWR}$. "Matching" the parallel-arm matching inductor(s) $L_{MP}$ means selecting an inductance value that resonates with (i.e., tunes out) the electrostatic capacitance C0 of the parallel-arm AWR $P_{AWR}$ around the center frequency of a desired passband. The resulting resonant LC tank circuit and the selection of the resonance/anti-resonance frequencies outside the passband makes the parallel-arm AWR filter building block 600 behave like an open circuit within the passband ($L_{MP}$ in parallel resonance with C0 in $P_{AWR}$).

Figure 7:
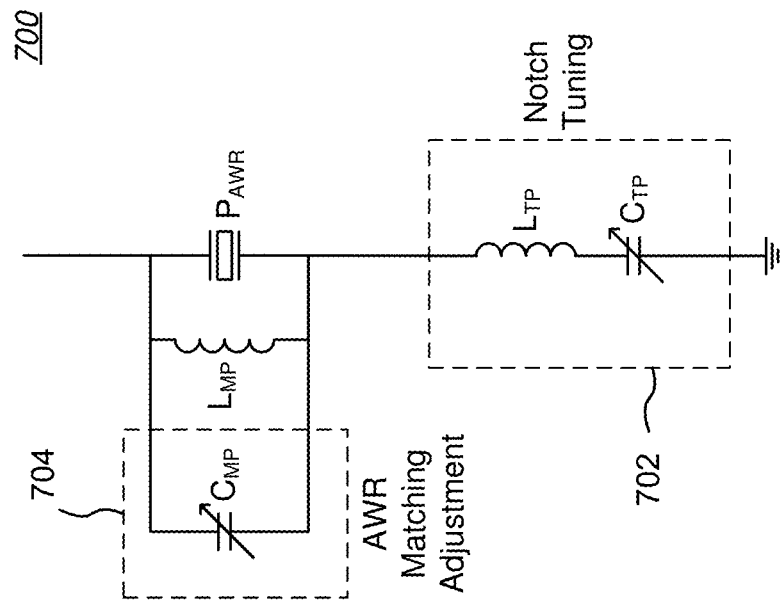
FIG. 7 is a schematic diagram of an advanced parallel-arm AWR filter building block in accordance with the present invention.

FIG. 7 is a schematic diagram of an advanced parallel-arm AWR filter building block 700 in accordance with the present invention. The advanced parallel-arm AWR filter building block 700 starts with the simple parallel-arm AWR filter building block 600 of FIG. 6 and adds one or two optional features.

The first optional feature in FIG. 7 is a parallel-arm Notch Tuning circuit 702 that includes, in the illustrated embodiment, a parallel-arm tuning inductor $L_{TP}$ and a parallel-arm tuning capacitor $C_{TP}$ coupled in series with the parallel-arm AWR $P_{AWR}$. The resulting LC parallel-arm Notch Tuning circuit 702 in series with the parallel-arm AWR $P_{AWR}$ allows tuning of the resonance characteristics of the advanced parallel-arm AWR filter building block 700 without affecting its anti-resonance frequency. The series (i.e., short-circuit) AWR resonance of the parallel-arm AWR filter building block 700 contributes to the notch/stopband, and the parallel-arm Notch Tuning circuit 702 adjusts the frequency that the parallel-arm AWR filter building block 700 contributes to the stopband/notch of an overall filter network. Consequently, in a complete RF filter with both series-arms and parallel-arms, the parallel-arm Notch Tuning circuit 702 provides the ability to tune the center frequency of the notch filter characteristics of the RF filter and/or the depth and width of the notch (see FIGS. 13 and 14 below for examples). Note that in some embodiments, the parallel-arm Notch Tuning circuit 702 may comprise only an adjustable parallel-arm tuning inductor $L_{TP}$ or only an adjustable parallel-arm tuning capacitor $C_{TP}$.

A second optional feature is a parallel-arm AWR Matching Adjustment circuit 704 that includes a parallel-arm match-adjustment capacitor $C_{MP}$ coupled in parallel with the parallel-arm AWR $S_{AWR}$ and the parallel-arm matching inductor $L_{MP}$. The combination of the parallel-arm matching inductor $L_{MP}$ and the parallel-arm match-adjustment capacitor $C_{MP}$ provides a variable LC circuit that can be used to more closely match the electrostatic capacitance C0 of the parallel-arm AWR $P_{AWR}$ so that the parallel-arm AWR filter building block 700 looks like an open-circuit within the passband frequency range. The parallel-arm match-adjustment capacitor $C_{MP}$ may be adjusted in one or more of the ways described above for the series-arm match-adjustment capacitor $C_{MS}$ of FIG. 5. Note that, in general, the series order of the $L_{TP}$, $C_{TP}$, and $P_{AWR}$ components does not matter as to the performance of the circuit. Again, in some cases, when the parasitic capacitance of the physical components to ground is taken into account, some orderings might perform slightly better than others.

Analogous to the series-arm AWR Matching Adjustment circuit 504 of FIG. 5, in the parallel-arm AWR Matching Adjustment circuit 704, the parallel-arm match-adjustment capacitor $C_{MP}$ is meant to "convert" matching inductor $L_{MP}$ into an adjustable effective inductance $L_{eff}$ consisting of $L_{MP}$ and $C_{MP}$ together. Since $L_{MP}$ and $C_{MP}$ are in parallel with each other (rather than in series as in FIG. 5), $L_{eff}$ is given by $L_{eff}=L_{MP}/\{1-(2\pi \times f)^2 \times L_{MP} \times C_{MP}\}$. Note that $L_{eff}$ is greater than $L_{MP}$ when $C_{MP}$ is present; setting $C_{MP}$ to zero in this expression yields $L_{eff}=L_{MP}$, which corresponds to the simple parallel-arm AWR filter building block 600 in which $C_{MP}$ is replaced by an open circuit (i.e., $C_{MP}$ is omitted). Thus, in order to make the "effective inductance" $L_{eff}$ encompass a value that "matches" (resonates) the capacitance C0 of the parallel-arm acoustic wave resonator $P_{AWR}$ at or near the center of the desired stopband/notch as $C_{MP}$ is varied upward from zero, the parallel-arm matching inductor $L_{MP}$ must have a smaller value than the parallel-arm matching inductor $L_{MP}$ in FIG. 6, in which $C_{MP}$="open circuit"="zero" (i.e., $C_{MP}$ is omitted).

Another way of characterizing a parallel-arm AWR filter building block encompassed by the present invention is as either (1) "partially hybridized", meaning that the parallel-arm AWR $P_{AWR}$ is coupled to the parallel-arm matching inductor $L_{MP}$, or (2) "fully hybridized", meaning that the parallel-arm AWR $P_{AWR}$ is coupled to the parallel-arm matching inductor $L_{MP}$ and the parallel-arm Notch Tuning circuit 702, and optionally coupled to the parallel-arm AWR Matching Adjustment circuit 704.

RF Filter Architectures

The series-arm AWR filter building blocks 400, 500 and the parallel-arm AWR filter building blocks 600, 700 may be combined to form a variety of RF filter architectures. In the RF filter architecture examples below, building blocks are shown with the optional Notch Tuning and AWR Match Adjustment circuitry of the advanced series-arm AWR filter building block 500 and the advanced parallel-arm AWR filter building block 700, but it should be understood that any of the architectures may be made using just the simple series-arm AWR filter building block 400 and the simple parallel-arm AWR filter building block 600. Of note, the simple and advanced types of AWR filter building blocks 400, 500, 600, 700 may be "mixed and matched" as desired for a particular application, although if an AWR Matching Adjustment circuits 504, 704 is used, it may be desirable to implement such circuits in both the series and shunt arms.

Figure 8:
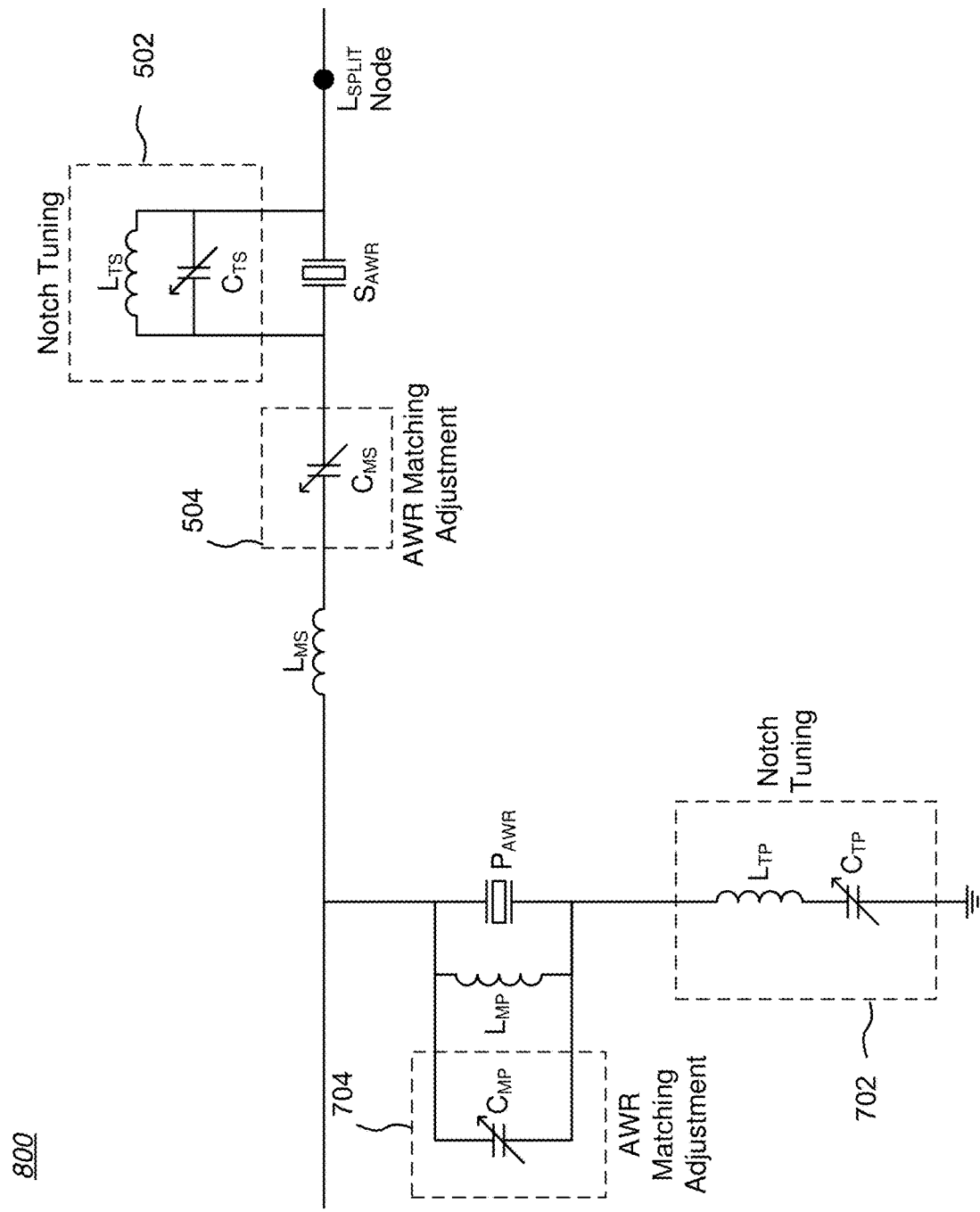
FIG. 8 is a schematic diagram of a L-type RF filter that combines one series-arm AWR filter building block with one parallel-arm AWR filter building block.

FIG. 8 is a schematic diagram of a L-type RF filter 800 that combines one series-arm AWR filter building block with one parallel-arm AWR filter building block. Note that in alternative embodiments, the parallel-arm AWR filter building block may be coupled to the $L_{SPLIT}$ Node of the series-arm AWR filter building block rather than as shown. However, depending on the exact system circuitry that precedes and follows the L-type RF filter 800, there may be some advantage to choosing a particular coupling point to the series-arm AWR filter building block for the parallel-arm AWR filter building block over other coupling points.

Figure 9:
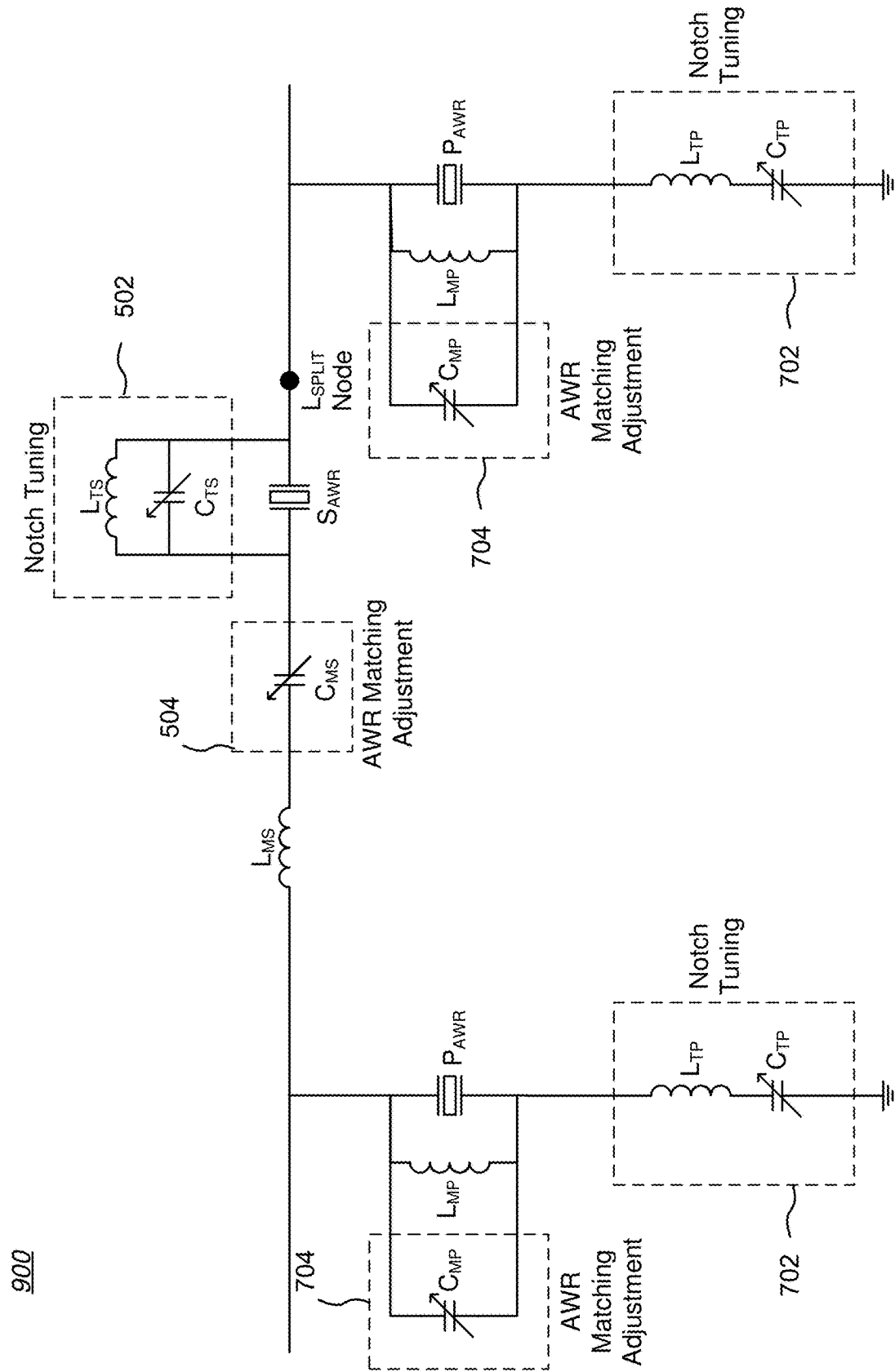
FIG. 9 is a schematic diagram of a Pi-type RF filter that combines one series-arm AWR filter building block with two bracketing parallel-arm AWR filter building blocks.

FIG. 9 is a schematic diagram of a Pi-type RF filter 900 that combines one series-arm AWR filter building block with two bracketing parallel-arm AWR filter building blocks.

Figure 10:
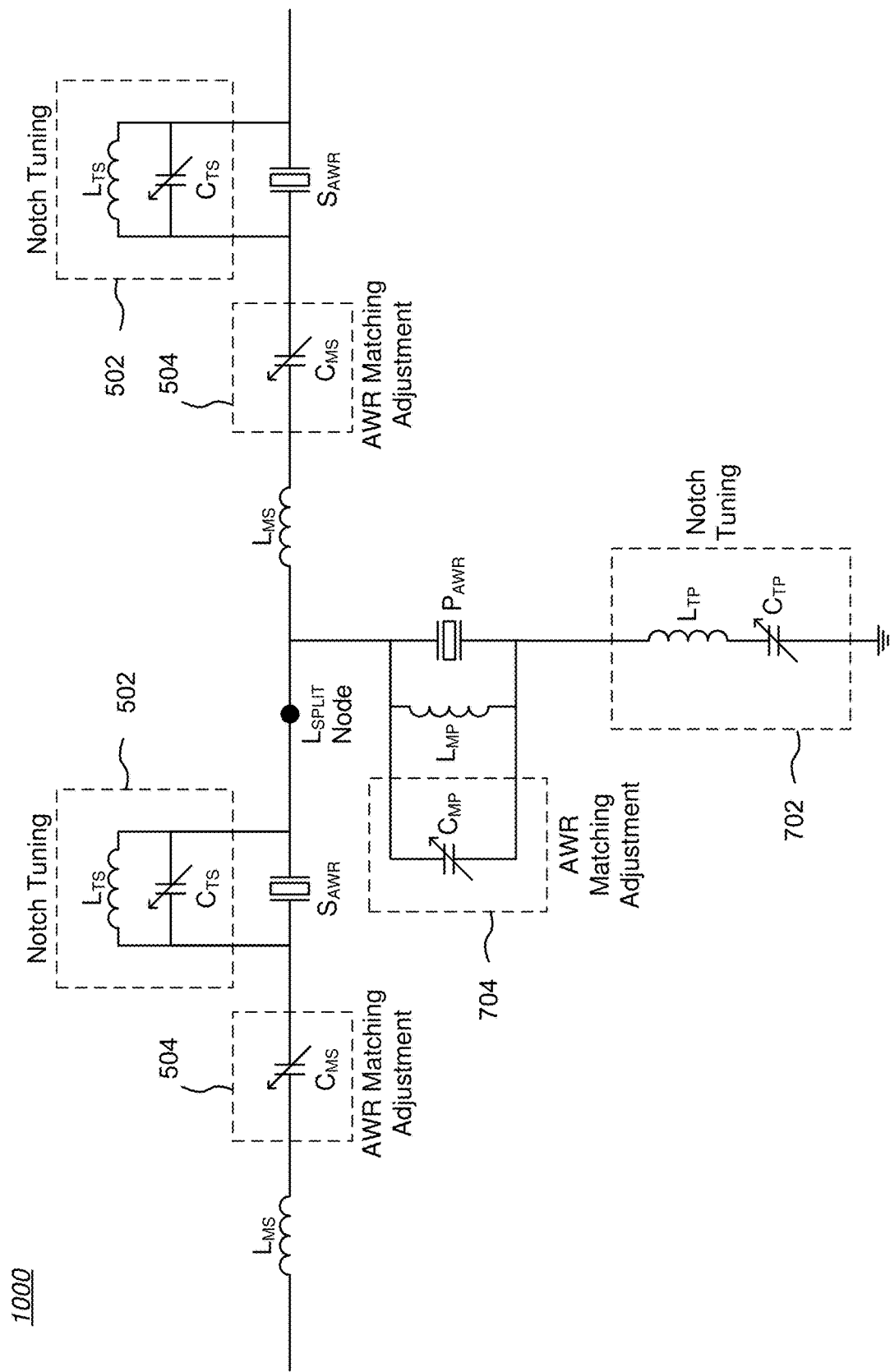
FIG. 10 is a schematic diagram of a T-type RF filter that combines two series-arm AWR filter building blocks with one intermediate parallel-arm AWR filter building block.

FIG. 10 is a schematic diagram of a T-type RF filter 1000 that combines two series-arm AWR filter building blocks with one intermediate parallel-arm AWR filter building block. A "bridged-T" type configuration would be a variation that would include at least a capacitor coupled to the unattached end terminals of the illustrated two series-arm AWR filter building blocks. When a bridged-T topology is used, the components in the "bridge" (i.e., the components connected directly between the unattached end terminals) as well as the components in the two series-arms AWR filter building blocks will affect more than one of the minima of a composite notch. Thus, while a bridged-T circuit may allow the same flexibility in notch tuning/adjustment as the L-type, Pi-type, T-type topologies (as well as the ladder topology described below), it is more difficult to determine the proper adjustments of all the variable components in a bridged-T topology. In contrast, in the disclosed topologies, each building block (series-arm or parallel-arm) controls exactly one of the minima in a composite notch.

Figure 11:
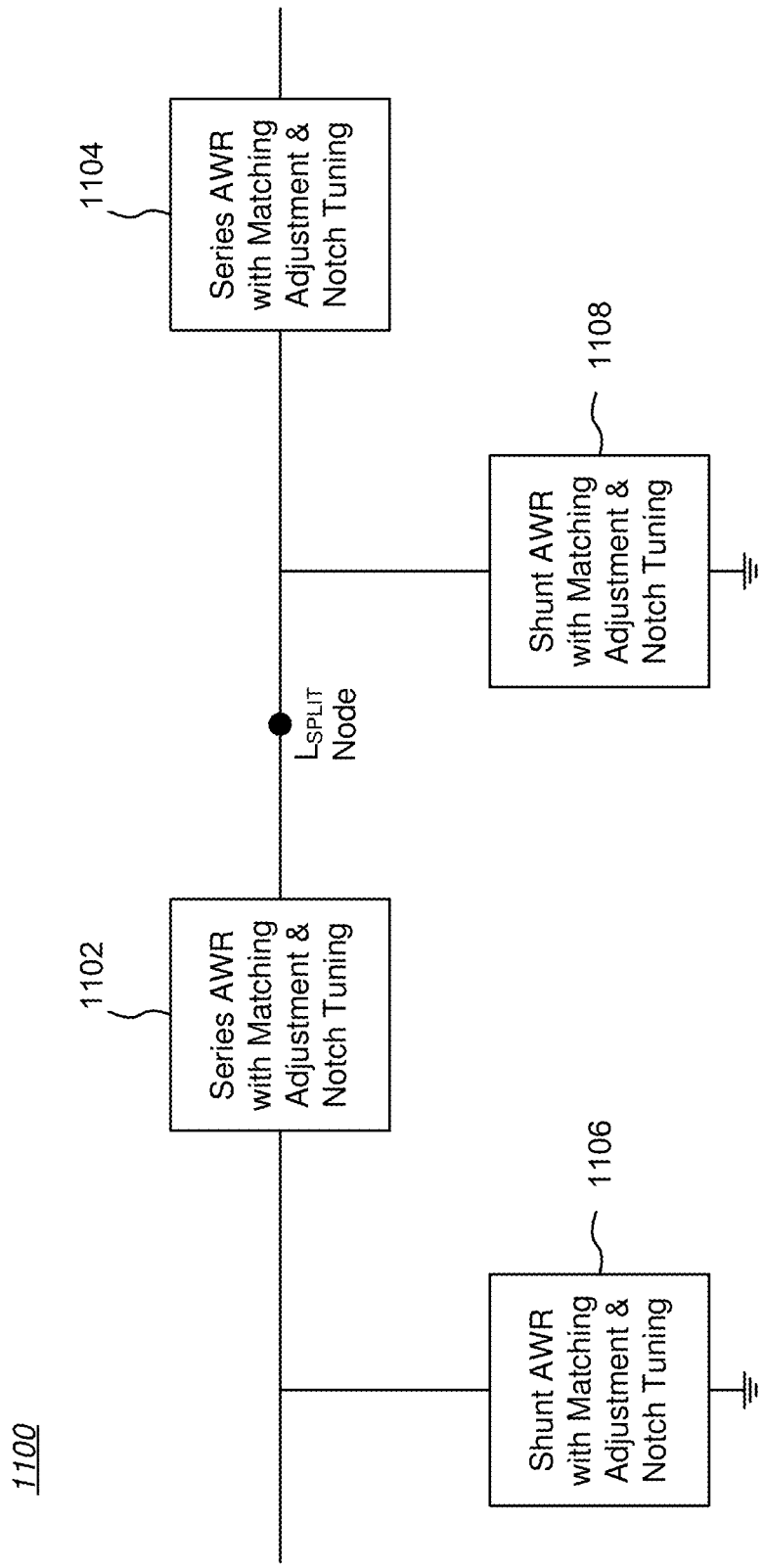
FIG. 11 is a block diagram a four-resonator "laddered" RF filter that combines two series-arm AWR filter building blocks, (in this example, with Notch Tuning and AWR Match Adjustment circuitry) and two parallel-arm AWR filter building blocks, (in this example, with Notch Tuning and AWR Match Adjustment circuitry).

The L-type, Pi-type, and T-type RF filters shown in FIGS. 8-10 are specific circuits using 2 or 3 AWR filter building blocks, and are simply instances of a more general "ladder" architecture having an alternating series-arm/parallel-arm network topology. For example, FIG. 11 is a block diagram a four-resonator "laddered" RF filter 1100 that combines two series-arm AWR filter building blocks 1102, 1104 (in this example, with Notch Tuning and AWR Match Adjustment circuitry) and two parallel-arm AWR filter building blocks 1106, 1108 (in this example, with Notch Tuning and AWR Match Adjustment circuitry). With suitable values for the series-arm and parallel-arm matching inductors $L_{MS}$, $L_{MP}$, the illustrated RF filter 1100 may be particularly useful for defining a sharp notch filter characteristic to protect a frequency band (e.g., the WiFi band), thereby allowing wireless operation on nearby frequencies without restrictions on resource block allocations and without requiring any (or any significant) transmission power reduction.

While FIG. 11 shows a four-resonator "laddered" RF filter 1100, additional series-arm and parallel-arm AWR filter building blocks may be added to the "ladder" to increase the number of resonators, trading off sharper notch filtering characteristics against increased signal attenuation. Further, while FIG. 11 shows an alternating series-arm/parallel-arm network topology, it is also possible to place more than one parallel-arm AWR filter building block or more than one series-arm AWR filter building block in immediate succession.

Other types of RF filter architectures or networks may be used with the series-arm AWR filter building blocks and parallel-arm AWR filter building blocks described above. Further, Also, one or more complete RF filter structures may be coupled together to form a larger circuit, such as a duplexer or diplexer.

Note that each series-arm AWR filter building block and parallel-arm AWR filter building block in a particular RF filter architecture introduces its own resonance/anti-resonance characteristic to the RF filter. As described below, the combination of the resonance/anti-resonance characteristics defines the center frequency, width, and depth (level of attenuation) of the stopband of the RF filter. It is the (open-circuit) anti-resonances of the series-arm AWR filter building blocks, and the (short-circuit) resonances of the parallel-arm AWR filter building blocks that contribute to the stopband.

RF Filter Design with Tuning and Matching

The inventive series-arm AWR filter building blocks 400, 500 and parallel-arm AWR filter building blocks 600, 700 essentially de-couple the stopband or notch characteristics of an RF filter from the passband characteristics of the RF filter. Accordingly, each of those de-coupled parameters can be individually designed to meet the specifications of a particular application. Partially-hybridized or fully-hybridized series-arm and parallel-arm AWR filter building blocks in accordance with the present invention can be used to build RF filters having "de-coupled" or essentially independent passband and stopband characteristics. Such "de-coupled" RF filters can have (1) wideband and low insertion loss passbands and (2) wideband deep notches (stopbands) with a specifically placed notch center frequency, without compromising the passband characteristics.

Figure 12A:
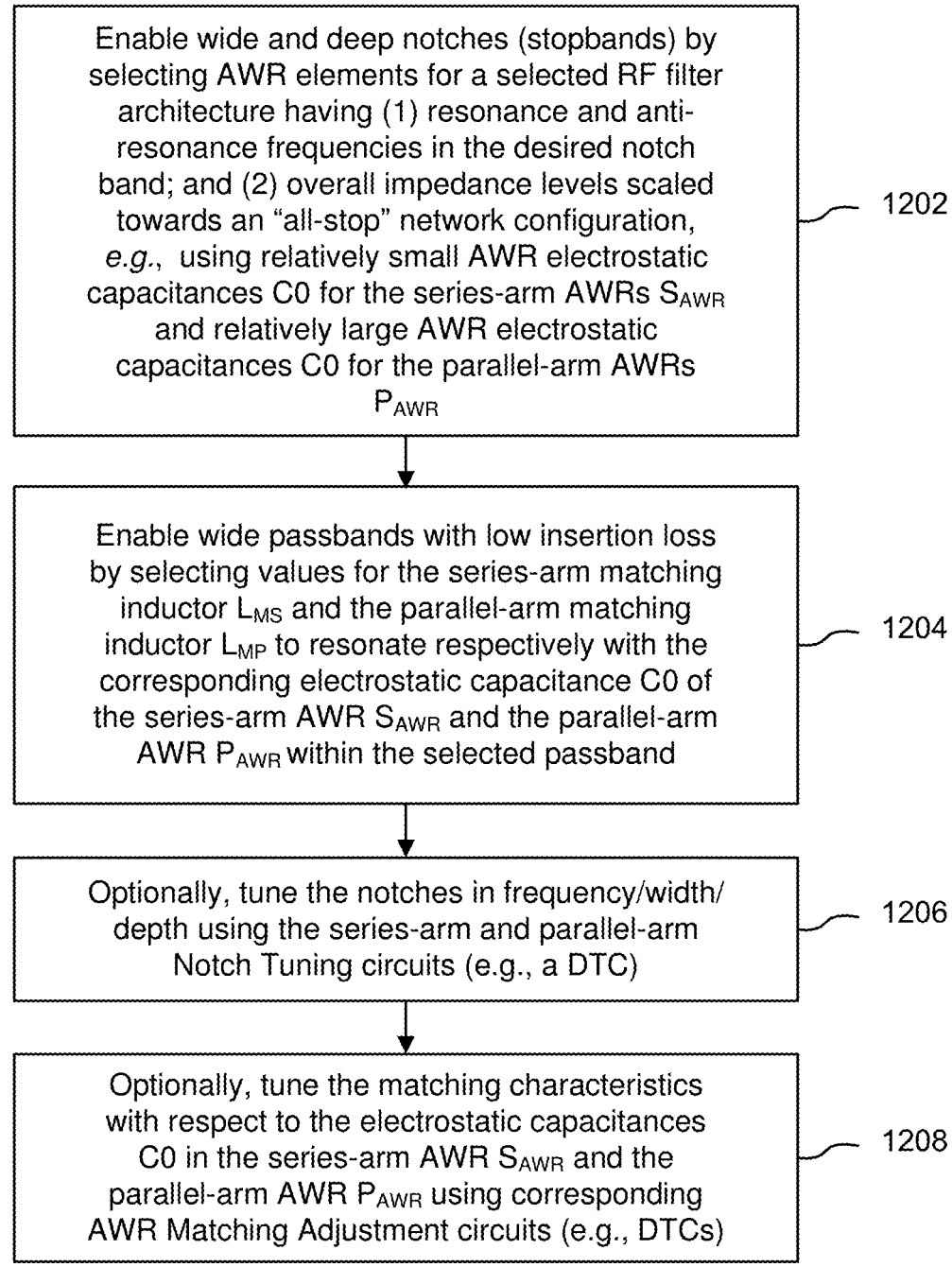
FIG. 12A is a process flow chart showing a summarized methodology for designing RF filters having essentially independent passband and stopband characteristic, and encompasses both partially-hybridized and fully-hybridized filter networks.

FIG. 12A is a process flow chart 1200 showing a summarized methodology for designing RF filters having essentially independent passband and stopband characteristics, and encompasses both partially-hybridized and fully-hybridized filter networks. The methodology applies to any RF filter architecture or network using the series-arm AWR filter building blocks 400, 500 and parallel-arm AWR filter building blocks 600, 700 described above.

A first step is to enable wide and deep notches (stopbands) by selecting AWR elements for a selected RF filter architecture having (1) resonance and anti-resonance frequencies in the desired notch band; and (2) overall impedance levels scaled towards an "all-stop" network configuration, e.g., using relatively small AWR electrostatic capacitances C0 for the series-arm AWRs $S_{AWR}$ and relatively large AWR electrostatic capacitances C0 for the parallel-arm AWRs $P_{AWR}$ [Block 1202]. This helps to make the series-arm AWRs $S_{AWR}$ better open circuits at their antiresonance frequency and the parallel-arm AWRs $P_{AWR}$ better short circuits at their resonance frequency. This results in a suitably deep notch at the desired notch frequency (displaced from the desired passband)—because of the good short-circuit and open-circuit behavior of the selected AWRs having their respective electrostatic capacitances C0 scaled low in series arms and high in parallel arms. Note that, prior to performing the next step (Block 1204), this filter structure would behave like an "all-stop" capacitive voltage divider at frequencies away from the notch, having somewhat high attenuation of all frequencies, including the desired passband.

Next, enable wide passbands with low insertion loss by selecting values for the series-arm matching inductor $L_{MS}$ and the parallel-arm matching inductor $L_{MP}$ to resonate respectively with the corresponding electrostatic capacitance C0 of the series-arm AWR $S_{AWR}$ and the parallel-arm AWR $P_{AWR}$ within the selected passband [Block 1204]. Thus, at the selected passband frequencies, the RF filter behaves nearly like a direct wire connection from input to output. At these passband frequencies, displaced from the notch frequencies, the AWR's themselves are (to a good approximation) acting as just electrostatic capacitors without mechanically-generated resonances, so that the matching inductors, resonating with the electrostatic capacitances of the AWRs, render series-arms as short circuits and parallel arms as open circuits. The insertion loss and bandwidth of the passband is determined by the inductance values and the Q factor of the matching inductors $L_{MS}$, $L_{MP}$.

Optionally, tune the notches in frequency/width/depth using the series-arm and parallel-arm Notch Tuning circuits (e.g., a DTC) [Block 1206]. Examples of such tuning are given below.

Optionally, tune the matching characteristics with respect to the electrostatic capacitances C0 in the series-arm AWR $S_{AWR}$ and the parallel-arm AWR $P_{AWR}$ using corresponding AWR Matching Adjustment circuits (e.g., DTCs) [Block 1208]. If this option is elected, thereby inserting variable capacitors $C_{MS}$ and/or $C_{MP}$, then for a specified passband and stopband the appropriate value of the matching inductors $L_{MS}$ and/or $L_{MP}$ will be different (that is, a larger $L_{MS}$ and/or smaller $L_{MP}$ will be needed) than would have been appropriate had this option not been elected.

Figure 12B:
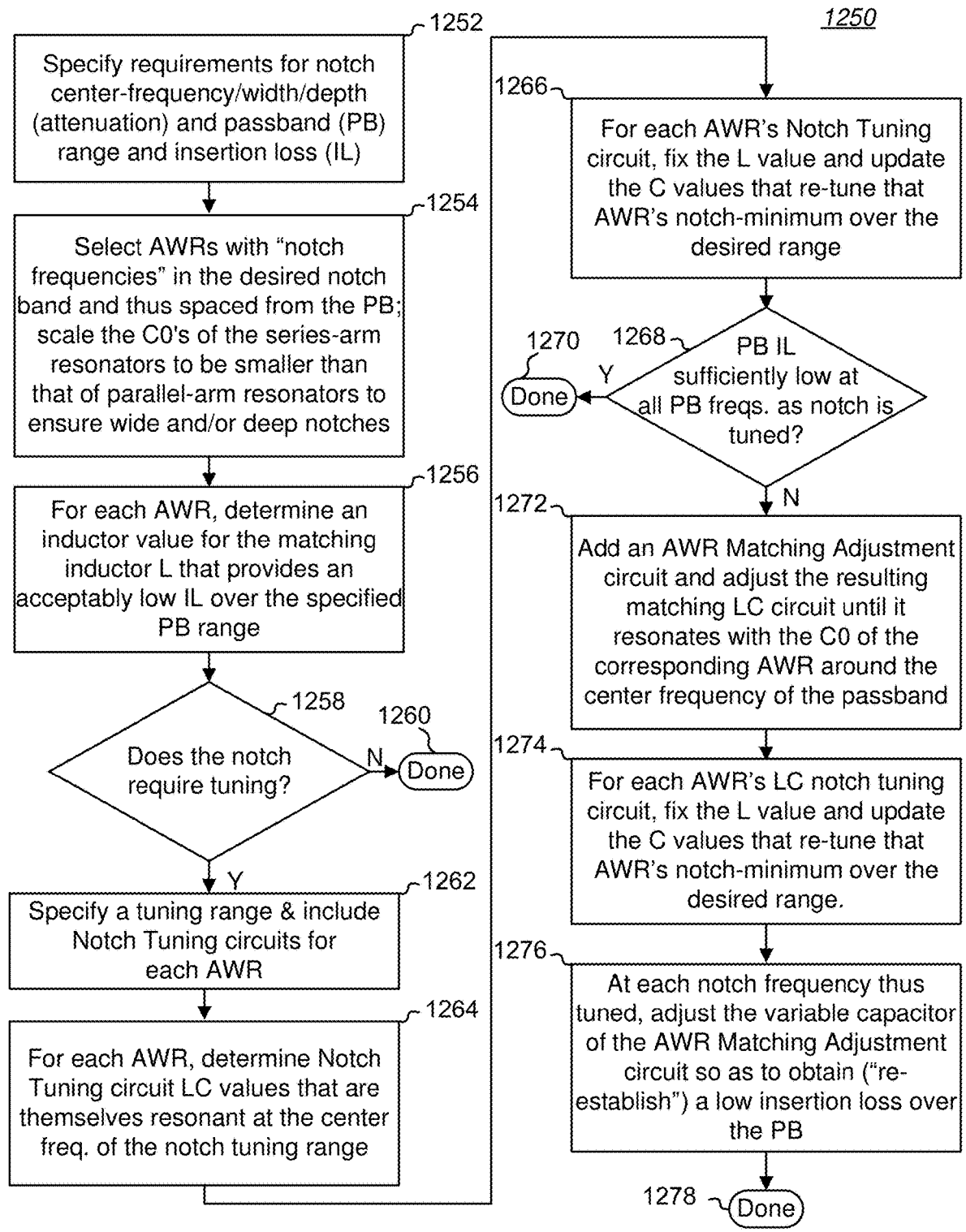
FIG. 12B is a process flow chart showing a detailed methodology for designing a particular partially-hybridized or fully-hybridized RF filter with AWR electrostatic capacitance matching, Notch Tuning, and AWR Matching Adjustment.

FIG. 12B is a process flow chart 1250 showing a detailed methodology for designing a particular partially-hybridized or fully-hybridized RF filter with AWR electrostatic capacitance matching, Notch Tuning, and AWR Matching Adjustment. The process includes:

Block 1252: Specify requirements for notch center-frequency/width/depth (attenuation) and passband (PB) range and insertion loss (IL). The specification may be a function of a requirement of a standards body or of a customer.

Block 1254: Select AWRs with "notch frequencies" (i.e., anti-resonance frequencies for series-arm resonators and resonance frequencies for parallel-arm resonators) in the desired notch band and thus spaced from the passband, and then scale the electrostatic capacitances C0 of the series-arm resonators to be smaller than that of parallel-arm resonators to ensure wide and/or deep notches. Note: if the tuning option (Block 1206) is not to be elected, ensure that the notch-frequencies of the AWR's fully span the desired notch band.

Block 1256: For each AWR, determine an inductor value for the matching inductor L that provides an acceptably low IL over the specified PB range. The value should resonate with the electrostatic capacitance C0 in the corresponding AWR at the center frequency of the passband.

Block 1258: Query: Does the notch require tuning?

Block 1260: If the notch does not require tuning, then the design is complete (done).

Block 1262: If the notch does require tuning, then specify a tuning range and include Notch Tuning circuits for each AWR.

Block 1264: For each AWR, determine Notch Tuning circuit LC values that are resonant at the center frequency of the notch tuning range. By selecting L and C values that self-resonate in the center of the notch tuning range, they are essentially "neutral" (i.e., do not move the AWR's notch-frequency) when thus "center-tuned". Then, per Block 1266, the notch-frequency of each AWR can be tuned lower or higher by setting the variable capacitor larger or smaller, respectively.

Block 1266: For each AWR's Notch Tuning circuit, fix the L value and select a sequence of C values that tune the AWR's notch-minimum over the desired range.

Block 1268: Query: Does the PB IL remain sufficiently low at all passband frequencies as the notch is tuned across the desired stopband range?

Block 1270: If the PB IL is sufficiently low after the notch is tuned, then the design is complete (done).

Block 1272: If the PB IL is not sufficiently low after the notch is tuned, then add an AWR Matching Adjustment circuits and adjust the resulting matching LC circuit until it resonates with the electrostatic capacitance C0 of the corresponding AWR around the center frequency of the passband. Again, if these LC match-adjustment circuits are added, the values of the series-arm matching inductor $L_{MS}$ and the parallel-arm matching inductor $L_{MP}$ will be different from the values specified in Block 1256. That is, a larger $L_{MS}$ and/or smaller $L_{MP}$ will be needed for the specified passband and stopband so that, at or near the center of the passband, the effective inductance of the LC circuit will be approximately equal to the inductance values specified in Block 1256.

Block 1274: For each AWR's LC notch tuning circuit, fix the L value and update the C values that re-tune that AWR's notch-minimum over the desired range.

Block 1276: At each notch frequency thus tuned, adjust the variable capacitor of the AWR Matching Adjustment circuit so as to obtain ("re-establish") a low (preferably the lowest) insertion loss over the PB.

Block 1278: The design is complete (done).

As a practical matter, a designer may choose a partially hybridized or a fully hybridized design as a goal, and thus a number of the steps in FIG. 12B may be skipped over or omitted. For example, if it is known in advance whether or not tuning adjustments will be needed and used, then the "updating" steps may not be needed. More generally, it should be kept in mind that, for a partially hybridized filter design without tuning and a fully hybridized filter design with tuning and matching adjustment intended for the same application (passband and stopband frequencies), the values of $L_{MS}$ and $L_{MP}$ would be different in the two designs. In the fully hybridized design with matching adjustment, $L_{MS}$ would have a larger value and $L_{MP}$ would have a smaller value compared to the values of the corresponding $L_{MS}$ and $L_{MP}$ components in the partially hybridized design. Each L and variable C adjustable matching circuit in the fully hybridized design is meant to look like a variable inductor having an adjustable effective inductance $L_{eff}$ in a range around the fixed values of $L_{MS}$ and $L_{MP}$ in the corresponding partially-hybridized design.

Tuning Examples

The center frequency, width, and depth of an RF filter notch in accordance with the present invention is initially determined by the selection of RF filter architecture and the specific AWR components for the series-arm AWRs $S_{AWR}$ and the parallel-arm AWRs $P_{AWR}$. Thus, the resonance/anti-resonance characteristics of a first set of three AWRs in a Pi-type filter generally produce a "composite" notch with 3 minima and a particular center frequency. For example, the first set of three AWRs may result in a "wide and shallow" notch having a notch 70 MHz wide at an attenuation level of about 30 dB. For a second first set of three AWRs with different resonance/anti-resonance characteristics, the center frequency may shift up or down in frequency and/or the width and depth of the notch may differ from the first set of three AWRs. For example, the second set of three AWRs may result in a "deep and narrow" notch having a notch 20 MHz wide at an attenuation level of about 75 dB. Thus, a particular set of RF filter characteristics can be achieved by selecting more closely-spaced or more widely-spaced "notch frequencies" (meaning anti-resonance frequency in the series arm, and resonance frequency in the parallel arm) among the resonators. Either partially-hybridized or fully-hybridized series-arm and parallel-arm AWR filter building blocks can be used, but a partially-hybridized design will not be tunable.

As noted above, in a fully-hybridized RF filter, tuning circuits are added to enable tuning of the composite AWR minima with respect to center frequency, width, and depth, as long as the resulting insertion loss versus frequency curve meets a specified attenuation-level requirement with respect to its width and has an appropriate center frequency. For example, a set of three AWR's having notch frequencies spaced apart may be selected so as to produce a certain (probably intermediate) notch depth and width. The notch tuning circuits on the three resonators may then be used to move the "notch frequencies" closer together or farther apart.

Figure 13:
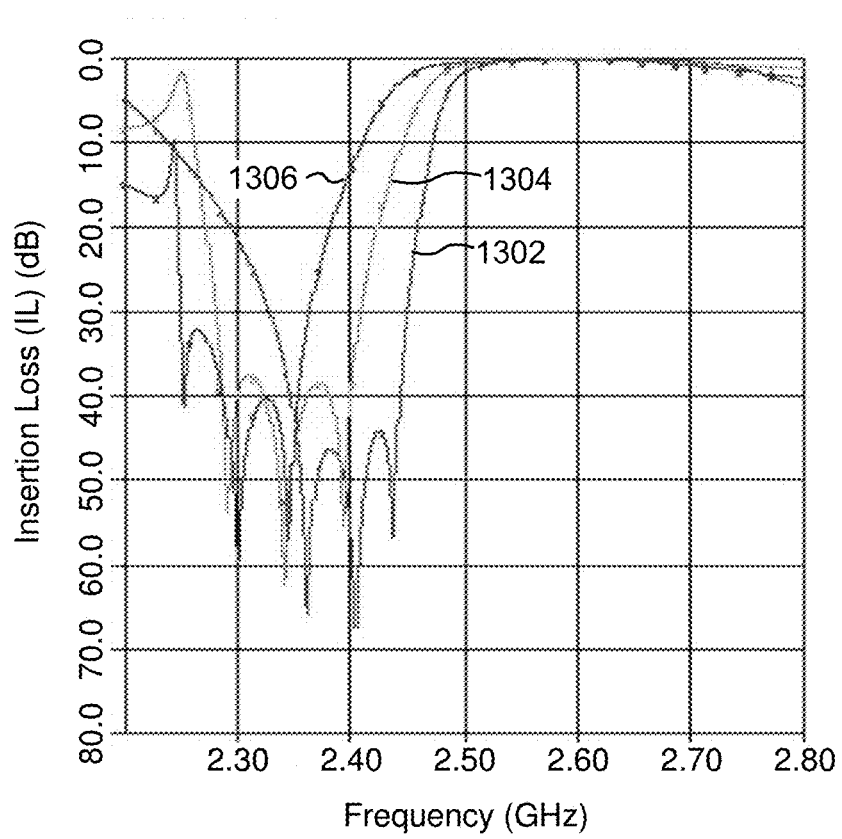
FIG. 13 is a graph of insertion loss (attenuation) as a function of frequency showing shifting of the notch center frequency of a fully-hybridized RF Pi-type filter across about a 100 MHz tuning range while maintaining about a 120 MHz stopband width and at least about 30 dB of attenuation.

FIG. 13 is a graph 1300 of insertion loss (attenuation) as a function of frequency showing shifting of the notch center frequency of a fully-hybridized RF Pi-type filter across about a 100 MHz tuning range while maintaining about a 120 MHz stopband width and at least about 30 dB of attenuation. As a Pi-type filter, the RF filter includes one series-arm AWR filter building block and two bracketing parallel-arm AWR filter building blocks (see FIG. 9), and accordingly combines three resonance/anti-resonance AWR characteristics.

Graph line 1302 represents the result of a first set of tuning values provided by the Notch Tuning circuits of the RF filter, emphasizing notch center frequency. Graph line 1302 has three minima, two "flyback" lobes between the outer minima, a center frequency of about 2.40 GHz, and a width of about 110 MHz at the 30 dB level of attenuation. Graph line 1304 represents the result of a second set of tuning values provided by the Notch Tuning circuits of the RF filter, showing a shift of the center frequency downward to about 2.34 GHz while maintaining a width of about 110 MHz at the 30 dB level of attenuation (although the flyback lobes are closer to the 30 dB level than for graph line 1302). Graph line 1306 represents the result of a third set of tuning values provided by the Notch Tuning circuits of the RF filter, showing a further shift of the center frequency downward to about 2.30 GHz while maintaining a width of about 110 MHz at the 30 dB level of attenuation (although one of the flyback lobes is even closer to the 30 dB level than for graph line 1304). Notably, for all three sets of tuning values, the passband from about 2.50 GHz to about 2.70 GHz has a very flat response and wide bandwidth. The bandwidth and spacing of the passband from the notch are larger than would typically be supported by the AWR by itself. The resulting filter has a response that have essentially "de-coupled" or independent passband and stopband characteristics without some of the constraints imposed by the $k_{eff}^2$ parameter of the AWR.

Thus, in the example shown in FIG. 13, the −1 dB bandwidth of the passband is at least 200 MHz centered at about 2.6 GHz, which is at least 7.7% fractional bandwidth. In contrast, a conventional prior art bandpass filter using the same AWR material used in these simulations (having a $k_{eff}^2$ of 0.09) could support a passband fractional bandwidth of only about $4 \times k_{eff}^2/\pi^2 = 3.6\%$ if the resonators were configured as shown in FIG. 3. In FIG. 13, the passband fractional bandwidth of at least 7.7%—more than twice that of a conventional design—is a property of the resonator capacitances C0 and the matching inductors $L_{MS}$, $L_{MP}$, and is not limited as in the conventional prior art bandpass filter paradigm.

Figure 14:
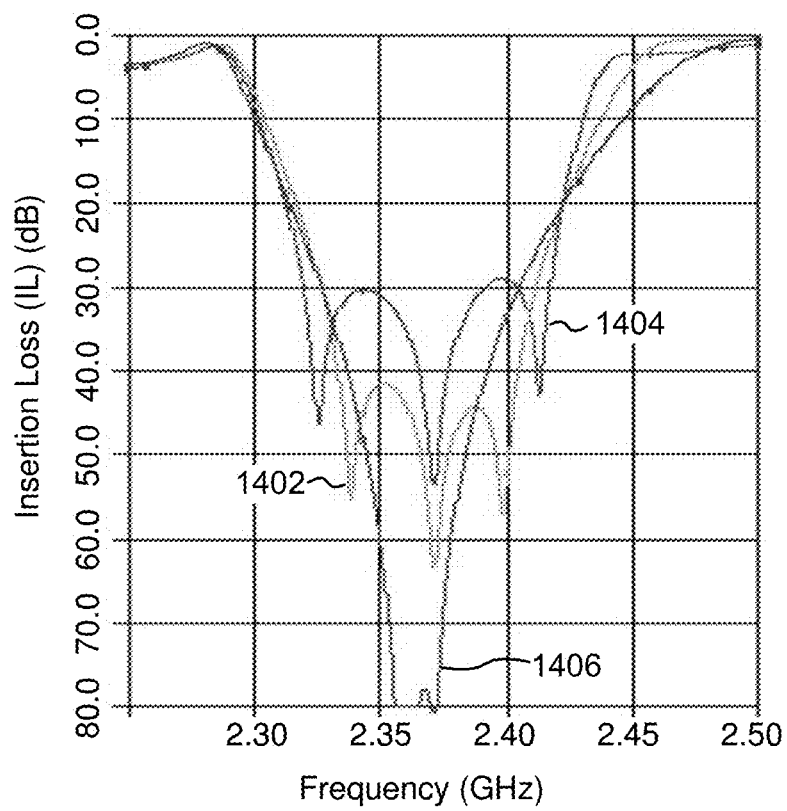
FIG. 14 is a graph of insertion loss (attenuation) as a function of frequency showing changing of the notch depth and width for a fully-hybridized RF Pi-type filter while maintaining at least about 30 dB of attenuation.

FIG. 14 is a graph 1400 of insertion loss (attenuation) as a function of frequency showing changing of the notch depth and width for a fully-hybridized RF Pi-type filter while holding at least 30 dB of attenuation. In this example, a set of three AWR's having notch frequencies spaced apart have been selected so as to produce an intermediate notch depth and width. Graph line 1402 represents the result of these selected "pre-tuning" values, with a center frequency of about 2.37 GHz, a notch width of about 75 MHz wide at the 40 dB level of attenuation and about 85 MHz at the 30 dB level of attenuation, three minima, and two "flyback" lobes between the outer minima. Graph line 1404 represents the result of a first set of tuning values provided by the Notch Tuning circuits of the RF filter, emphasizing notch width over depth. Graph line 1404 has a center frequency of about 2.37 GHz and a notch width of about 100 MHz at the 30 dB level of attenuation. Graph line 1406 represents the result of a second set of tuning values provided by the Notch Tuning circuits of the RF filter, emphasizing notch depth over width. Graph line 1406 has a center frequency of about 2.365 GHz, a notch width of about 50 MHz at about the 60 dB level of attenuation and about 70 MHz at the 30 dB level of attenuation. While not shown in FIG. 14, the passband from about 2.50 GHz to about 2.70 GHz has a very flat response and wide bandwidth for all three sets of tuning values.

Micro-Level Tuning Capability

An additional aspect of embodiments of the present invention that incorporate DTCs in Notch Tuning circuits and/or AWR Matching Adjustment circuits is a "micro-level tuning" capability. Such embodiments may have their tuning parameters defined during production testing or by a customer on a one-time basis (e.g., to configure a transceiver for the wireless standards in a particular region or of a particular operator). However, in DTC-based embodiments of the Notch Tuning circuits and/or AWR Matching Adjustment circuits, adjustments may be under program control and thus settable dynamically in response to environmental (physical and RF) factors, such as temperature, changing transmission leakage characteristics, transmitter power settings, receiver sensitivity, bands in use, etc.

For example, transmission leakage characteristics may change depending on how a resource block allocation is configured, such as contiguous vs. non-contiguous resource block allocation, the bandwidth of the resource block allocation, and the offset of resource block allocation positions from the band edge (e.g., the lower frequency band edge of n41 in the case of n41 and n40/n30/Wi-Fi coexistence). As another example, the intermodulation distortion (IMD) order dominating the transmission interference/leakage may change dynamically along with the behavior of any particular intermodulation distortion order itself. For instance, in the 5G n41 band, the $5^{th}$-order IMD for bandwidths of 50-100 MHz, and the $3^{rd}$-order IMD for bandwidths of 100 MHz, may fall within the n40 band and violate a co-existence requirement set by a standards body (e.g., the 3rd Generation Partnership Project). There may also be cases where a filter would need to be adjusted as a result of carrier aggregation configurations or simply for a wideband filter that can be adjusted to accommodate different selected bands at different times (e.g., a reconfigurable filter). Accordingly, it may be useful to micro-level tune the center frequency, width, and/or depth of a notch, and/or micro-level tune the matching of a matching inductor $L_{MS}$, $L_{MP}$ to respond to such varying factors in real time.

Scaling with AWR Technology

A benefit of embodiments of the present invention is that the inventive hybrid filter architectures can be applied to any AWR technology. By de-coupling the stopband or notch characteristics of an RF filter from the passband characteristics of the RF filter (by hybridizing an acoustic wave resonator $S_{AWR}$, $P_{AWR}$ with a matching inductor that resonates with the associated capacitance C0 of the AWR), filter performance scales with the bandwidth capability of the AWR without some of the constraints imposed by the $k_{eff}^2$ parameter of the AWR. A further notable advantageous result is that wider and deeper notches in embodiments of the invention become possible as the $k_{eff}^2$ parameter of an individual resonator increases.

Figure 15:
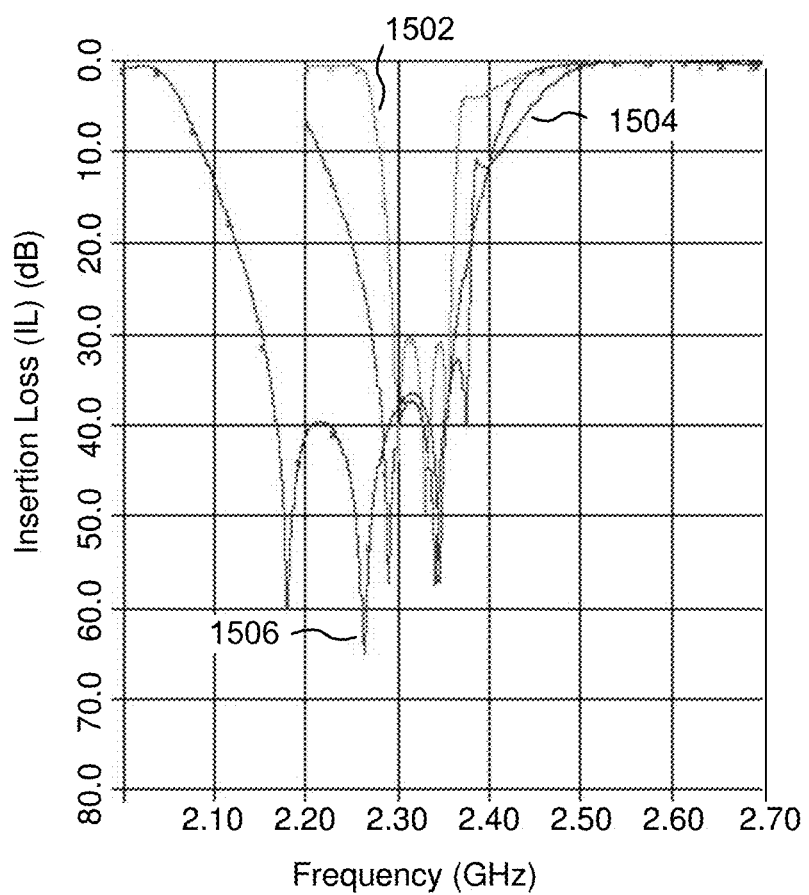
FIG. 15 is a graph of insertion loss (attenuation) as a function of frequency comparing the frequency response of a partially-hybridized Pi-type RF filters using BAW, SAW, or XBAR resonators.

For example, FIG. 15 is a graph 1500 of insertion loss (attenuation) as a function of frequency comparing the frequency response of a partially-hybridized Pi-type RF filters using BAW, SAW, or XBAR resonators. The RF filters included a matching inductor $L_{MS}$ for the series-arm AWR $S_{AWR}$ and corresponding matching inductors $L_{MP}$ for the two parallel-arm AWRs $P_{AWR}$, but did not include Notch Tuning circuits or AWR Matching Adjustment circuits.

Graph line 1502 represents use of SAW AWRs ($k_{eff}^2 \approx 0.044$) in the series-arm and parallel-arms of the RF filter. Graph line 1504 represents use of BAW AWRs ($k_{eff}^2 \approx 0.09$) in the series-arm and parallel-arms of the RF filter. Graph line 1506 represents use of XBAR AWRs ($k_{eff}^2 \approx 0.20$) in the series-arm and parallel-arms of the RF filter. As graph line 1506 indicates, use of XBAR AWRs allows a very wide initial notch with flyback maintained well below 30 dB.

In addition, the use of matching inductor $L_{MS}$, $L_{MP}$ results in very low insertion loss in the passband (2.5-2.7 GHz) even though the AWR resonance/anti-resonance impedances are selected or scaled towards "all-stop" levels to get good notch depth. The passband may also be a bit wider and flatter with higher values of $k_{eff}^2$, but that effect is not as dramatic as the effect of higher values of $k_e f$ on the stopband.

Comparison to Conventional (Pure AWR or Pure LC) Filters

By de-coupling individual AWR characteristics from passband bandwidth, embodiments of the present invention exceed the capabilities of purely AWR RF filters using any kind of resonators (e.g., SAW, BAW, XBAR), as well as the capabilities of purely LC RF filters. TABLE 1 below summarizes important differences in such conventional RF filters compared to partially-hybridized and fully-hybridized embodiments of the present invention.

TABLE 1

| Topology | Characteristics | Remarks |
|---|---|---|
| Pure LC | Resonator Q's too low for a steep, narrow transition between stopband and passband | Cannot have both a low-loss passband and a deep stopband close enough to each other for most applications |
| Pure AWR | In general, a tradeoff between passband IL and notch depth & width (passband width is dependent on parameter $k_{eff}^2$) | The fractional bandwidth of the passband cannot exceed about $0.5 \times k_{eff}^2$ (typically a few percent) when using a traditional band-pass ladder topology with resonators designed as in FIG. 3. If, instead, AWR's are used without L's to attempt an independent passband and stopband according to the present invention, a deep notch and low-loss passband cannot be achieved simultaneously. Deep notch requires "all-stop" C0 scaling, but low-IL passband requires the opposite ("all-pass") C0 scaling. |
| Partially Hybridized | Low IL passband and deep/wide notches (passband width is independent of parameter $k_{eff}^2$) | Matching circuits allow building of a wide-band passband with low IL; notch frequency, depth, and width are independently controlled by the selection of AWRs with resonance/anti-resonance frequencies spaced apart from passband and by AWR center frequency spacing. |
| Fully Hybridized | Partially Hybridized characteristics plus tunable notches (frequency, depth, width) | Allows fine tuning of hybridized filter and allows micro-level tuning in some embodiments. |

System Aspects

Embodiments of the present invention are useful in a wide variety of larger radio frequency (RF) circuits and systems, including radio systems, cellular telephones, personal computers, tablet computers, wireless network components, televisions, cable system "set top" boxes, automobile communication systems, wireless sensing devices, radar systems, and test equipment. Further, performance enhancements to the RF filters in a transmitter, receiver, or transceiver can have broad impact to system performance. Improvements in RF filters can enable system performance improvements such as longer battery life, higher data rates, greater network capacity, lower cost, enhanced security, higher reliability, etc. These improvements can be realized at many levels of an RF system both separately and in combination, for example at the RF circuit, RF module, mobile or fixed sub-system, or network levels.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 16:
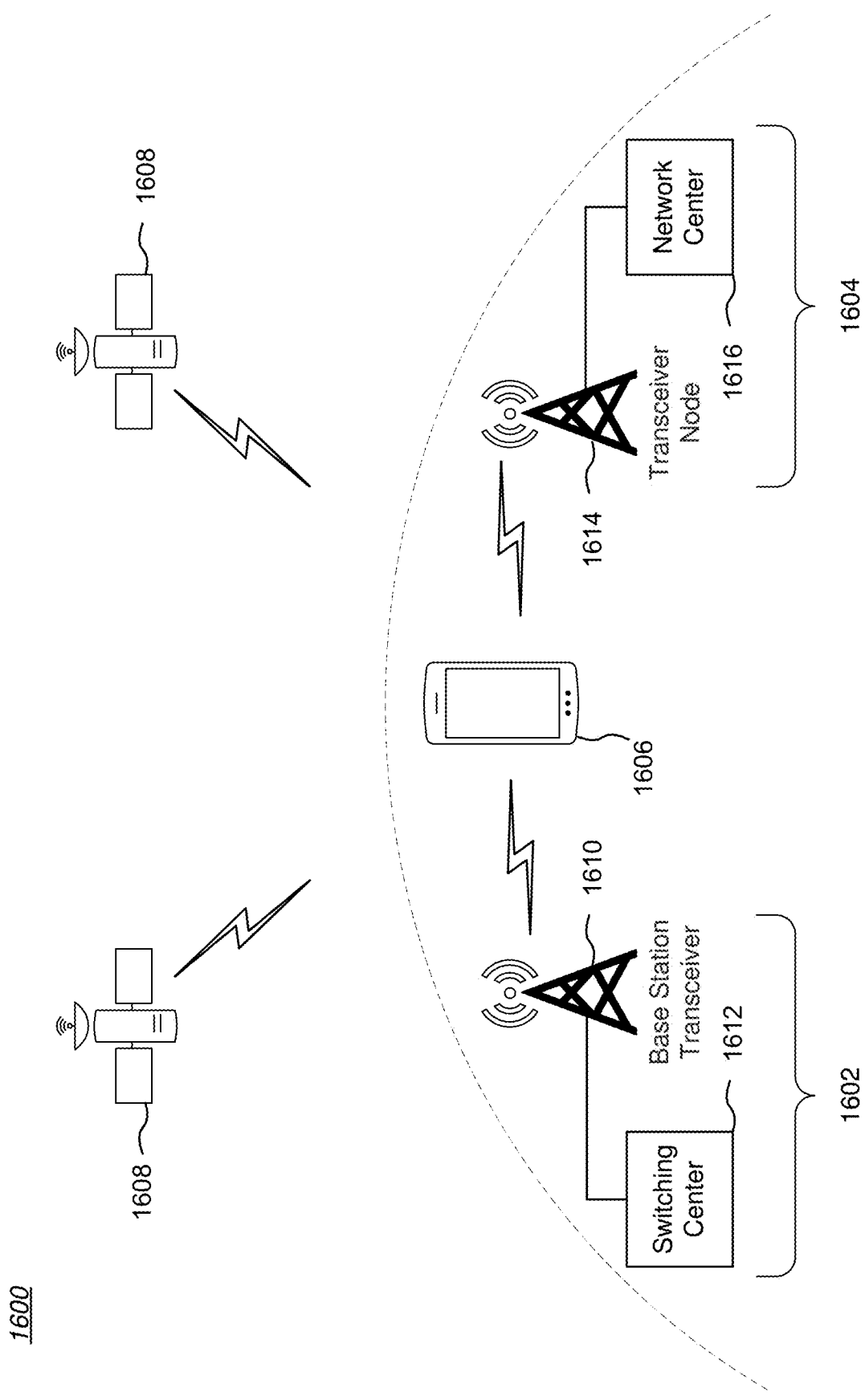
FIG. 16 illustrates an exemplary prior art wireless communication environment comprising different wireless communication systems, and may include one or more mobile wireless devices.

As an example of wireless RF system usage, FIG. 16 illustrates an exemplary prior art wireless communication environment 1600 comprising different wireless communication systems 1602 and 1604, and may include one or more mobile wireless devices 1606.

A wireless device 1606 may be capable of communicating with multiple wireless communication systems 1602, 1604 using one or more of the telecommunication protocols noted above. A wireless device 1606 also may be capable of communicating with one or more satellites 1608, such as navigation satellites (e.g., GPS) and/or telecommunication satellites. The wireless device 1606 may be equipped with multiple antennas, externally and/or internally, for operation on different frequencies and/or to provide diversity against deleterious path effects such as fading and multi-path interference. A wireless device 1606 may be a cellular phone, a personal digital assistant (PDA), a wireless-enabled computer or tablet, or some other wireless communication unit or device. A wireless device 1606 may also be referred to as a mobile station, user equipment, an access terminal, or some other terminology.

The wireless system 1602 may be, for example, a CDMA-based system that includes one or more base station transceivers (BSTs) 1610 and at least one switching center (SC) 1612. Each BST 1610 provides over-the-air RF communication for wireless devices 1606 within its coverage area. The SC 1612 couples to one or more BSTs in the wireless system 1602 and provides coordination and control for those BSTs.

The wireless system 1604 may be, for example, a TDMA-based system that includes one or more transceiver nodes 1614 and a network center (NC) 1616. Each transceiver node 1614 provides over-the-air RF communication for wireless devices 1606 within its coverage area. The NC 1616 couples to one or more transceiver nodes 1614 in the wireless system 1604 and provides coordination and control for those transceiver nodes 1614.

In general, each BST 1610 and transceiver node 1614 is a fixed station that provides communication coverage for wireless devices 1606, and may also be referred to as base stations or some other terminology. The SC 1612 and the NC 1616 are network entities that provide coordination and control for the base stations and may also be referred to by other terminologies.

Figure 1:
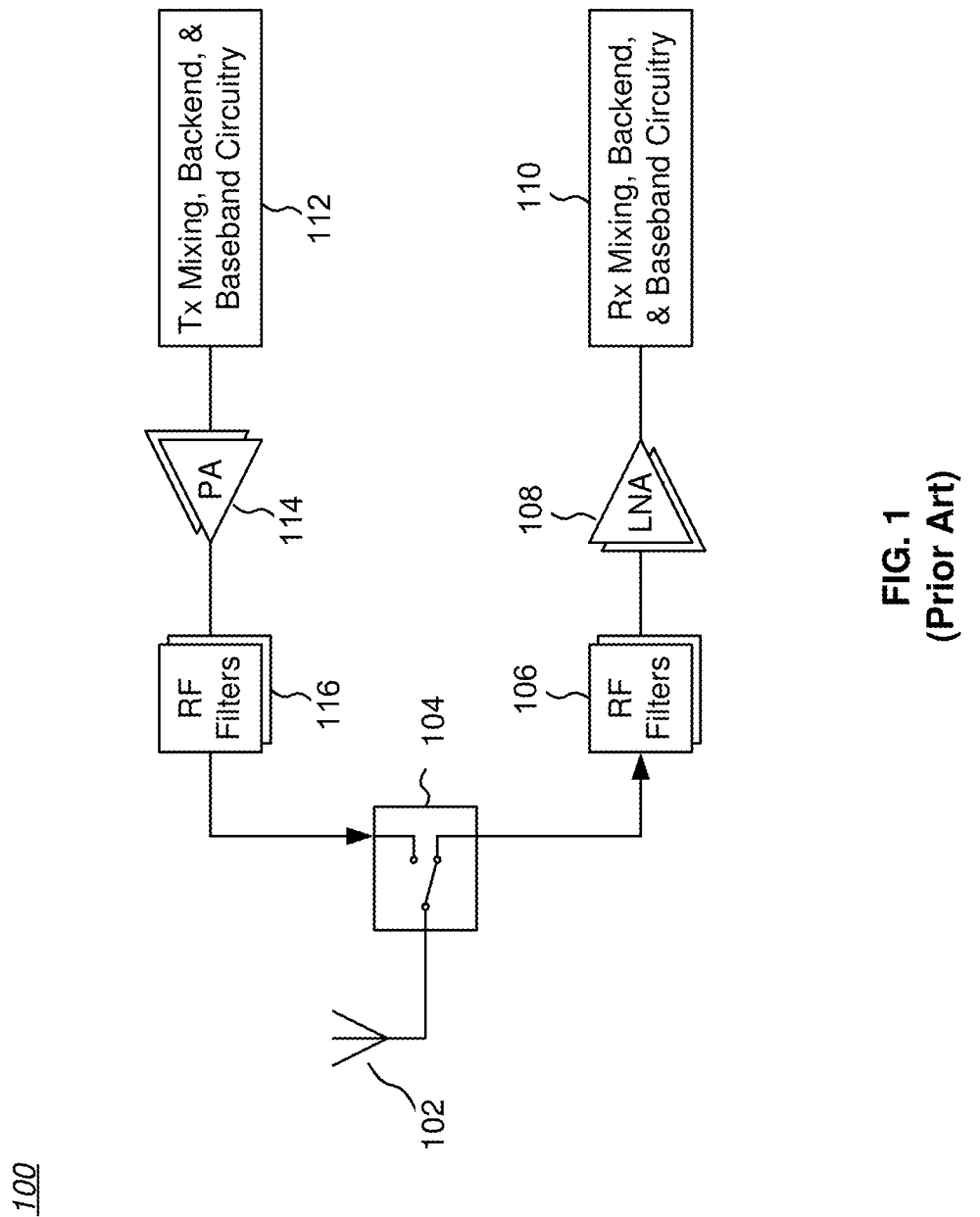
FIG. 1 is a simplified block diagram of a prior art transceiver.
Figure 17:
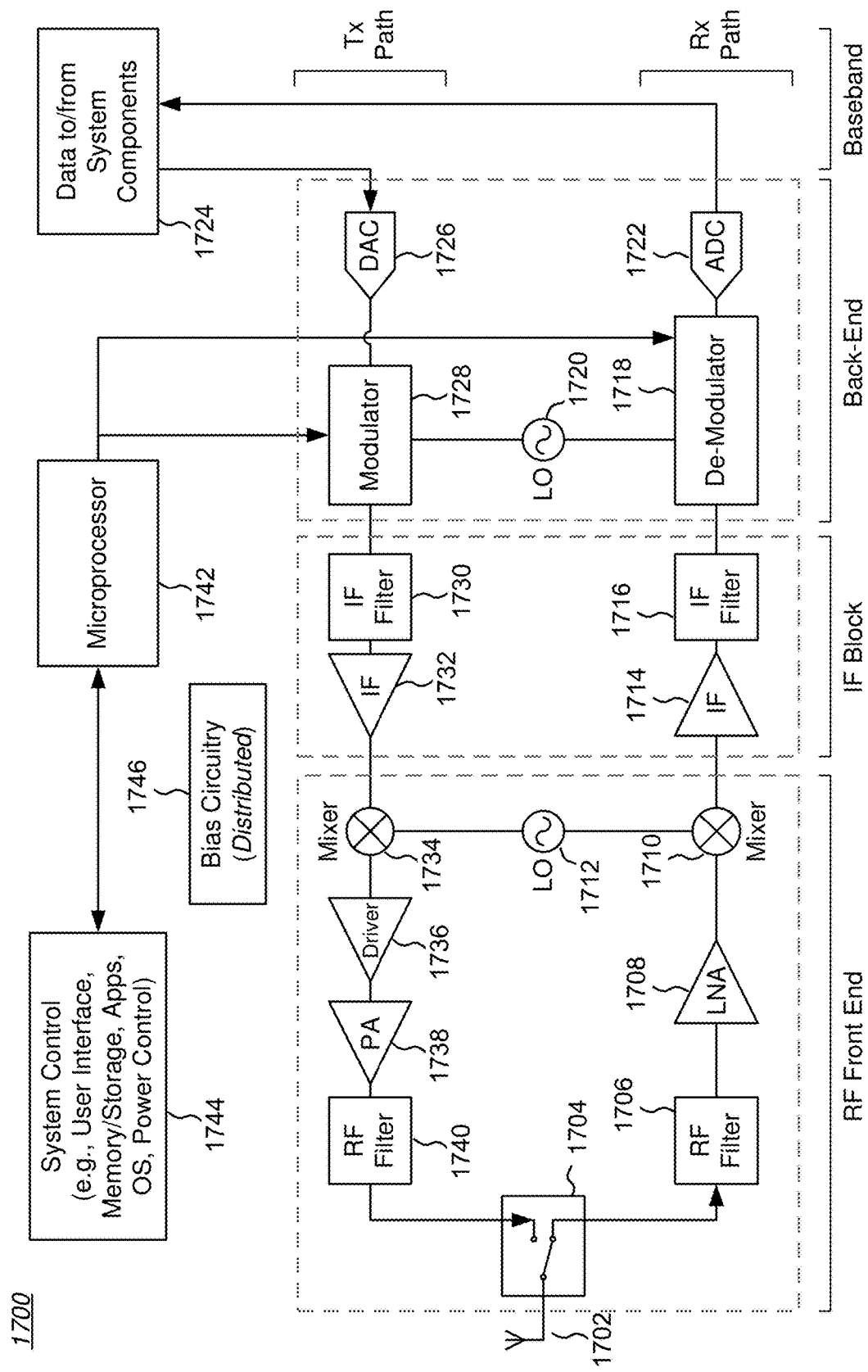
FIG. 17 is a more detailed block diagram of a transceiver that might be used in a wireless device, such as a cellular telephone, and which may beneficially incorporate embodiments of the present invention for improved performance.

An important aspect of any wireless system, including the systems shown in FIG. 16, is in the details of how the component elements of the system perform. FIG. 1 is a simplified block diagram of a transceiver 100. However, FIG. 17 is a more detailed block diagram of a transceiver 1700 that might be used in a wireless device, such as a cellular telephone, and which may beneficially incorporate embodiments of the present invention for improved performance. As illustrated, the transceiver 1700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different). The transceiver 1700 may comprise discrete components and/or one or more integrated circuits within a module and/or on a circuit board, or may be fully integrated into a single integrated circuit.

The receiver path Rx receives over-the-air RF signals through an antenna 1702 and a switching unit 1704, which may be implemented with active switching devices (e.g., field effect transistors or FETs, particularly MOSFETs), or with passive devices that implement frequency-domain multiplexing, such as a diplexer or duplexer. An RF filter 1706 passes desired received RF signals to a low noise amplifier (LNA) 1708, the output of which is combined in a mixer 1710 with the output of a first local oscillator 1712 to produce an intermediate frequency (IF) signal. The RF filter 1706 may include one or more partially-hybridized or fully-hybridized RF filters in accordance the present invention.

The IF signal may be amplified by an IF amplifier 1714 and subjected to an IF filter 1716 before being applied to a demodulator 1718, which may be coupled to a second local oscillator 1720. The IF amplifier 1714 may include one or more partially-hybridized or fully-hybridized RF filters in accordance the present invention. The demodulated output of the demodulator 1718 is transformed to a digital signal by an analog-to-digital converter 1722 and provided to one or more system components 1724 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1724 is transformed to an analog signal by a digital-to-analog converter 1726, the output of which is applied to a modulator 1728, which also may be coupled to the second local oscillator 1720. The modulated output of the modulator 1728 may be subjected to an IF filter 1730 before being amplified by an IF amplifier 1732. The IF filter 1730 may include one or more partially-hybridized or fully-hybridized RF filters in accordance the present invention. The output of the IF amplifier 1732 is then combined in a mixer 1734 with the output of the first local oscillator 1712 to produce an RF signal. The RF signal may be amplified by a driver 1736, the output of which is applied to a power amplifier (PA) 1738. The amplified RF signal may be coupled to an RF filter 1740, the output of which is coupled to the antenna 1702 through the switching unit 1704. The RF filter 1740 may include one or more partially-hybridized or fully-hybridized RF filters in accordance the present invention.

The operation of the transceiver 1700 is controlled by a microprocessor 1742 in known fashion, which interacts with system control components (e.g., user interfaces, memory/storage devices, application programs, operating system software, power control, etc.). In addition, the transceiver 1700 will generally include other circuitry, such as bias circuitry 1746 (which may be distributed throughout the transceiver 1700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1700 may be in a positioned in a different order (e.g., the filters) or omitted. Other components can be (and often are) added (e.g., additional filters, impedance matching networks, variable phase shifters/attenuators, power dividers, etc.).

In order to comply with increasingly stringent system standards and customer requirements relating to rejection of RF interference, power consumption, and general efficiency and effectiveness, the current invention is critical to the overall solution shown in FIG. 17. The current invention therefore specifically includes a system-level embodiment that is enabled by inclusion in that system of embodiments in accordance with the above disclosure and with the claims set forth below.

Methods

Another aspect of the invention includes methods for making a radio frequency filter circuit based on a plurality of acoustic wave resonators (AWRs) and having a passband and a notch band. For example, one such method may include: selecting a series-arm AWR having an electrostatic capacitance C0 small enough to be compatible with a desired stopband depth and a resonance frequency and an anti-resonance frequency spaced apart in frequency from a desired passband; selecting a parallel-arm AWR having an electrostatic capacitance C0 large enough to be compatible with the desired stopband depth and a resonance frequency and an anti-resonance frequency spaced apart in frequency from the desired passband; coupling the parallel-arm AWR in a shunt configuration with the series-arm AWR; tuning out the electrostatic capacitance C0 of the series-arm AWR within the desired passband; and tuning out the electrostatic capacitance C0 of the parallel-arm AWR within the desired passband, wherein the series-arm AWR anti-resonance frequencies and the parallel-arm AWR resonance frequencies define a notch band for the radio frequency filter circuit.

Another such method may include: selecting a series-arm AWR having an electrostatic capacitance C0 small enough to be compatible with a desired stopband depth and a resonance frequency and an anti-resonance frequency spaced apart in frequency from the passband; coupling a series-arm matching inductor in series with the series-arm AWR, the series-arm matching inductor having an inductance value that resonates with the electrostatic capacitance C0 of the series-arm AWR within the passband; selecting a parallel-arm AWR having an electrostatic capacitance C0 large enough to be compatible with the desired stopband depth and a resonance frequency and an anti-resonance frequency spaced apart in frequency from the passband; coupling a parallel-arm matching inductor in parallel with the parallel-arm AWR, the parallel-arm matching inductor having an inductance value that resonates with the electrostatic capacitance C0 of the parallel-arm AWR within the passband; and coupling the parallel-arm AWR in a shunt configuration with the series-arm AWR; wherein the series-arm AWR and the parallel-arm AWR resonance frequencies and the anti-resonance frequencies define the notch band for the radio frequency filter circuit.

Additional aspects of the above methods may include one or more of the following: coupling a series-arm notch tuning circuit in parallel with the series-arm AWR for tuning at least one of a notch band center frequency, a notch band width, and/or a notch band depth of the radio frequency filter circuit; coupling a parallel-arm notch tuning circuit in series with the parallel-arm AWR for tuning at least one of a notch band center frequency, a notch band width, and/or a notch band depth of the radio frequency filter circuit; coupling a series-arm notch tuning circuit in parallel with the series-arm AWR and coupling a parallel-arm notch tuning circuit in series with the parallel-arm AWR, for tuning at least one of a notch band center frequency, a notch band width, and/or a notch band depth of the radio frequency filter circuit; coupling a series-arm AWR matching adjustment circuit in series with the series-arm AWR and the series-arm matching inductor for adjusting the resonance of the series-arm matching inductor with the electrostatic capacitance C0 of the series-arm AWR within the desired passband; coupling a parallel-arm AWR matching adjustment circuit in parallel with the parallel-arm AWR and the parallel-arm matching inductor for adjusting the resonance of the parallel-arm matching inductor with the electrostatic capacitance C0 of the parallel-arm AWR within the desired passband; coupling a series-arm AWR matching adjustment circuit in series with the series-arm AWR and the series-arm matching inductor, and coupling a parallel-arm AWR matching adjustment circuit in parallel with the parallel-arm AWR and the parallel-arm matching inductor, for adjusting the resonance of the respective coupled matching inductor with the electrostatic capacitance C0 of the coupled AWR within the desired passband.

Fabrication Technologies & Options

It should be appreciated that RF filters embodying one or more of the circuit architectures encompassed by the present invention may be fabricated using conventional integrated circuit (IC) manufacturing techniques, and that ICs embodying such RF filters may include additional active and passive components. For example, any of the RF filters disclosed above may be integrated in whole or in part on the same IC die as an RF switching unit and/or an LNA ("in part" meaning that some components of the RF filters may be off-die).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Accordingly, embodiments of the invention include RF filter circuits based on a plurality of AWRs in accordance with the teachings of this disclosure incorporated into a module configured to be combinable with other components, wherein the module may include one or more additional circuit components or blocks. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency filter circuit based on a plurality of acoustic wave resonators (AWR) and having a specified notch band and a specified passband, the radio frequency filter circuit and including:
   (a) at least one series-arm each including:
      (1) a series-arm AWR having an electrostatic capacitance C0 and selected to have a resonance frequency and an anti-resonance frequency associated with the series- arm AWR, wherein the anti-resonance frequency is within the specified notch band, and the resonance frequency and the anti-resonance frequency are both spaced apart in frequency from the specified passband; and
      (2) a series-arm matching inductor coupled in series with the series-arm AWR to form a first inductor-capacitor circuit and having an inductance value that resonates with the electrostatic capacitance C0 of the series-arm AWR within the specified passband; and
   (b) at least one parallel-arm coupled to the at least one series-arm and including:
      (1) a parallel-arm AWR having an electrostatic capacitance C0 and selected to have a resonance frequency and an anti-resonance frequency associated with the parallel-arm AWR, wherein the resonance frequency is within the specified notch band, and the resonance frequency and the anti-resonance frequency are both spaced apart in frequency from the specified passband; and
      (2) a parallel-arm matching inductor coupled in parallel with the parallel-arm AWR to form a second inductor-capacitor circuit and having an inductance value that resonates with the electrostatic capacitance C0 of the parallel-arm AWR within the specified passband;
   wherein the anti-resonance frequency of the at least one series-arm and the anti-resonance frequency of the coupled at least one parallel-arm are selected to form a notch filter;
   wherein the first inductor-capacitor circuit and the selection of the resonance and anti-resonance frequencies of the at least one series-arm AWR spaced apart from the specified passband makes the at least one series-arm AWR behave like a short-circuit within the specified passband;
   wherein the second inductor-capacitor circuit and the selection of the resonance and anti-resonance frequencies of the at least one parallel-arm AWR spaced apart from the specified passband makes the at least one parallel-arm AWR behave like an open circuit within the specified passband.

2. The invention of claim 1, further including a series-arm notch tuning circuit coupled in parallel with the series-arm AWR.

3. The invention of claim 2, wherein the series-arm notch tuning circuit includes at least one of an adjustable series-arm tuning inductor or an adjustable series-arm tuning capacitor configured to change at least one of a notch center frequency, a notch width, and/or a notch depth of the radio frequency filter circuit.

4. The invention of claim 1, further including a parallel-arm notch tuning circuit coupled in series with the parallel-arm AWR.

5. The invention of claim 4, wherein the parallel-arm notch tuning circuit includes at least one of an adjustable parallel-arm tuning inductor and/or an adjustable parallel-arm tuning capacitor configured to change at least one of a notch center frequency, a notch width, and/or a notch depth of the specified notch band of the radio frequency filter circuit.

6. The invention of claim 1, further including a series-arm AWR matching adjustment circuit coupled in series with the series-arm AWR and the series-arm matching inductor.

7. The invention of claim 6, wherein the series-arm AWR matching adjustment circuit includes a series-arm match-adjustment capacitor which, in combination with the series-arm matching inductor, provides an adjustable effective inductance configurable to resonate with the electrostatic capacitance C0 of the series-arm AWR within the specified passband.

8. The invention of claim 1, further including a parallel-arm AWR matching adjustment circuit coupled in parallel with the parallel-arm AWR and the parallel-arm matching inductor.

9. The invention of claim 8, wherein the parallel-arm AWR matching adjustment circuit includes a parallel-arm match-adjustment capacitor which, in combination with the parallel-arm matching inductor, provides an adjustable effective inductance configurable to resonate with the electrostatic capacitance C0 of the parallel-arm AWR within the specified passband.

10. The invention of claim 1, further including a series-arm notch tuning circuit coupled in parallel with the series-arm AWR and a parallel-arm notch tuning circuit coupled in series with the parallel-arm AWR.

11. The invention of claim 10, wherein the series-arm notch tuning circuit and the parallel-arm notch tuning circuit each include an adjustable circuit including at least one of an adjustable tuning inductor and/or an adjustable tuning capacitor and configured to change at least one of a notch center frequency, a notch width, and/or a notch depth of the specified notch band of the radio frequency filter circuit.

12. The invention of claim 1, further including a series-arm AWR matching adjustment circuit coupled in series with the series-arm AWR and the series-arm matching inductor, and a parallel-arm AWR matching adjustment circuit coupled in parallel with the parallel-arm AWR and the parallel-arm matching inductor.

13. The invention of claim 12, wherein the series-arm AWR matching adjustment circuit and the parallel-arm AWR matching adjustment circuit each include a respective match-adjustment capacitor configured to adjust the resonance of the coupled matching inductor with the electrostatic capacitance C0 of the coupled AWR within the specified passband.

* * * * *